(12) United States Patent
Canella et al.

(10) Patent No.: US 6,417,484 B1
(45) Date of Patent: Jul. 9, 2002

(54) LASER MARKING SYSTEM FOR DICE CARRIED IN TRAYS AND METHOD OF OPERATION

(75) Inventors: Robert L. Canella; Tony T. Ibarra, both of Nampa, ID (US)

(73) Assignee: Micron Electronics, Inc., Nampa, ID (US)

(*) Notice: Subject to any disclaimer, the term of this patent is extended or adjusted under 35 U.S.C. 154(b) by 0 days.

(21) Appl. No.: 09/217,040

(22) Filed: Dec. 21, 1998

(51) Int. Cl.[7] ............................................... B23K 26/00
(52) U.S. Cl. .............................. 219/121.68; 219/121.69
(58) Field of Search ....................... 219/121.82, 121.68, 219/121.69, 121.67; 414/222.01, 222.13; 198/347.1

(56) References Cited

U.S. PATENT DOCUMENTS

| | | |
|---|---|---|
| 2,357,600 A | 9/1944 | Pabst |
| 2,413,767 A | 1/1947 | Hyde |
| 2,454,548 A | 11/1948 | Brinkert |
| 2,495,541 A | 1/1950 | Nolan, Jr. |
| 3,239,218 A | 3/1966 | Reeves |

(List continued on next page.)

FOREIGN PATENT DOCUMENTS

| | | |
|---|---|---|
| CA | 843232 | 6/1970 |
| DE | 243 798 | 3/1987 |
| EP | 0 653 791 A1 | 10/1994 |
| EP | 0 653 791 | 5/1995 |
| FR | 1.284.603 | 1/1961 |

(List continued on next page.)

OTHER PUBLICATIONS

Pending Patent Application, "An Apparatus for Actuating the Retaining Locks of a Cassette" (without claims or abstract), Ser. No. 08/923,359, filed Sep. 8, 1997.
Pending Patent Application, "Integrated Circuit Chip Handling Apparatus and Method" (without claims or abstract), Ser. No. 09/307,498, filed May 7, 1999.
Pending Patent Application "Automated Multi–Chip Module Handler, Method of Module Handling, and Module Magazine" (without claims or abstract), Ser. No. 09/065, 799, filed Apr. 23, 1998.

(List continued on next page.)

*Primary Examiner*—Tom Dunn
*Assistant Examiner*—Jonathan Johnson
(74) *Attorney, Agent, or Firm*—TraskBritt

(57) ABSTRACT

A laser marking system for IC packages including a tray input shuttle assembly, a tray transport borne by a transport actuator for moving a cooperatively configured tray carrier carrying a tray of unmarked packaged ICs received from the tray input shuttle assembly to a tray output shuttle assembly over a transport actuator path extending under an open-bottomed enclosure of a laser marking station. The tray input shuttle assembly, laser marking station and tray output shuttle assembly each has associated therewith a sliding wedge-type lift mechanism for raising and lowering the tray carrier vertically with respect to the transport so as to facilitate tray loading of the tray carrier from a stack of trays on the tray input shuttle assembly, insertion and withdrawal of the tray carrier bearing a tray of packaged ICs for marking into and out of the marking station and unloading of a tray of marked packaged ICs from the tray carrier onto a stack of trays on the output shuttle assembly. The lift mechanisms and tray shuttle assemblies may each be driven by air cylinders. A method of operation of the laser marking system is also disclosed.

9 Claims, 18 Drawing Sheets

U.S. PATENT DOCUMENTS

| | | |
|---|---|---|
| 3,254,776 A | 6/1966 | Brown |
| 3,327,889 A | 6/1967 | Dore |
| 3,625,384 A * | 12/1971 | Boerger et al. |
| 3,628,672 A | 12/1971 | Heinz |
| 3,774,352 A | 11/1973 | Weber |
| 3,799,017 A | 3/1974 | Halligan |
| 3,837,510 A | 9/1974 | McWilliams |
| 3,887,997 A | 6/1975 | Hartleroad et al. |
| 3,903,934 A | 9/1975 | Vizy |
| 3,917,983 A * | 11/1975 | Kuronen |
| 3,937,386 A | 2/1976 | Hartleroad et al. |
| 3,969,813 A | 7/1976 | Minetti et al. |
| 3,973,665 A * | 8/1976 | Giammanco |
| 4,024,545 A | 5/1977 | Dowling et al. |
| 4,030,622 A * | 6/1977 | Brooks et al. |
| 4,058,217 A | 11/1977 | Vaughan et al. |
| 4,095,095 A | 6/1978 | Muraoka et al. |
| 4,097,715 A | 6/1978 | Frizzi |
| 4,123,044 A | 10/1978 | Petzi |
| 4,178,531 A | 12/1979 | Alig |
| 4,203,486 A * | 5/1980 | Rubbright et al. |
| 4,323,755 A | 4/1982 | Nierenberg |
| 4,346,284 A | 8/1982 | Grollimund et al. |
| 4,352,617 A | 10/1982 | Sakai et al. |
| 4,353,796 A | 10/1982 | Kubo et al. |
| 4,354,770 A | 10/1982 | Block |
| 4,370,542 A | 1/1983 | Mills et al. |
| 4,375,025 A | 2/1983 | Carlson |
| 4,382,580 A | 5/1983 | Hellander |
| 4,403,134 A | 9/1983 | Klingel |
| 4,461,073 A | 7/1984 | Harringer et al. |
| 4,493,767 A | 1/1985 | Monteyne |
| 4,510,673 A | 4/1985 | Shils et al. |
| 4,517,436 A | 5/1985 | Lawrence |
| 4,534,695 A * | 8/1985 | Stump et al. |
| 4,539,878 A | 9/1985 | Linker et al. |
| 4,543,716 A | 10/1985 | Damiano et al. |
| 4,552,271 A | 11/1985 | Kranz |
| 4,577,563 A | 3/1986 | Sidler |
| 4,610,359 A | 9/1986 | Muller |
| 4,616,414 A | 10/1986 | Cushman |
| 4,626,656 A | 12/1986 | Ootsuka et al. |
| 4,630,513 A | 12/1986 | Keller |
| 4,638,144 A | 1/1987 | Latta, Jr. |
| D288,273 S | 2/1987 | Gould |
| 4,644,126 A * | 2/1987 | Schumacher |
| 4,665,298 A | 5/1987 | La Rocca |
| 4,677,370 A | 6/1987 | Tustaniwskyj et al. |
| 4,696,096 A | 9/1987 | Green et al. |
| 4,711,334 A | 12/1987 | Barry et al. |
| 4,718,531 A | 1/1988 | Bianchi et al. |
| 4,767,984 A | 8/1988 | Bakker |
| 4,772,079 A | 9/1988 | Douglas et al. |
| 4,790,515 A | 12/1988 | Pocci |
| 4,791,267 A | 12/1988 | Yokoyama et al. |
| 4,818,835 A | 4/1989 | Kuwabara et al. |
| 4,832,612 A | 5/1989 | Grabbe et al. |
| 4,884,420 A | 12/1989 | Finkel et al. |
| 4,891,242 A | 1/1990 | Ito et al. |
| 4,914,269 A | 4/1990 | Kinsman et al. |
| 4,916,293 A | 4/1990 | Cartlidge et al. |
| 4,926,677 A | 5/1990 | Waldner |
| 4,944,492 A | 7/1990 | Nonaka |
| 4,947,981 A | 8/1990 | Dorner et al. |
| 4,965,927 A | 10/1990 | Holzman |
| H906 H | 4/1991 | Baggett et al. |
| 5,043,657 A | 8/1991 | Amazeen et al. |
| 5,090,664 A | 2/1992 | McCullough et al. |
| 5,102,291 A * | 4/1992 | Hine |
| 5,113,992 A * | 5/1992 | Sadamori |
| 5,117,963 A | 6/1992 | Thayer et al. |
| 5,127,837 A | 7/1992 | Shah et al. |
| 5,150,797 A * | 9/1992 | Shibata |
| 5,177,368 A | 1/1993 | Kay |
| 5,204,987 A | 4/1993 | Klingel |
| 5,218,894 A | 6/1993 | College et al. |
| 5,219,765 A | 6/1993 | Yoshida et al. |
| 5,226,361 A | 7/1993 | Grant et al. |
| 5,245,166 A | 9/1993 | Shepard |
| 5,245,900 A | 9/1993 | Dojnik |
| 5,256,578 A | 10/1993 | Corley et al. |
| 5,260,542 A | 11/1993 | Ishiguro et al. |
| 5,263,567 A | 11/1993 | Costa |
| 5,279,975 A | 1/1994 | Devereaux et al. |
| 5,290,134 A | 3/1994 | Baba |
| 5,302,798 A | 4/1994 | Inagawa et al. |
| 5,307,010 A | 4/1994 | Chiu |
| 5,313,156 A | 5/1994 | Klug et al. |
| 5,315,094 A | 5/1994 | Lisy |
| 5,322,173 A | 6/1994 | Kay |
| 5,332,463 A | 7/1994 | Eberlein et al. |
| 5,357,077 A | 10/1994 | Tsuruta |
| 5,360,747 A | 11/1994 | Larson et al. |
| 5,365,653 A | 11/1994 | Padrun |
| 5,375,320 A | 12/1994 | Kinsman et al. |
| 5,379,514 A | 1/1995 | Okuda et al. |
| 5,399,828 A | 3/1995 | Riddle et al. |
| 5,402,563 A | 4/1995 | Satoh et al. |
| 5,427,349 A | 6/1995 | Obrecht |
| 5,458,158 A | 10/1995 | Kawanabe |
| 5,463,227 A | 10/1995 | Stern et al. |
| 5,465,470 A | 11/1995 | Vongfuangfoo et al. |
| 5,466,908 A | 11/1995 | Hosoya et al. |
| 5,467,023 A | 11/1995 | Takeyama |
| 5,479,694 A | 1/1996 | Baldwin |
| 5,481,202 A | 1/1996 | Frye, Jr. |
| 5,487,471 A | 1/1996 | Marchek et al. |
| 5,498,851 A | 3/1996 | Hayashi et al. |
| D371,021 S | 6/1996 | Pine et al. |
| 5,566,414 A | 10/1996 | Nonaka |
| 5,566,840 A | 10/1996 | Waldner et al. |
| 5,587,094 A | 12/1996 | Yoshida et al. |
| 5,588,797 A | 12/1996 | Smith |
| 5,600,150 A | 2/1997 | Stern et al. |
| 5,605,641 A | 2/1997 | Chiba et al. |
| 5,629,484 A | 5/1997 | Liska |
| 5,632,083 A | 5/1997 | Tada et al. |
| 5,632,915 A | 5/1997 | Schnetzer et al. |
| 5,638,958 A | 6/1997 | Sanchez |
| 5,643,477 A | 7/1997 | Gullo et al. |
| 5,653,900 A | 8/1997 | Clement et al. |
| 5,654,204 A | 8/1997 | Anderson |
| 5,665,609 A | 9/1997 | Mori |
| 5,691,544 A | 11/1997 | Stern et al. |
| 5,717,162 A | 2/1998 | Matsuoka |
| 5,719,372 A | 2/1998 | Togari et al. |
| 5,722,639 A | 3/1998 | Nonaka |
| 5,761,301 A | 6/1998 | Oshima et al. |
| 5,793,051 A | 8/1998 | Stern et al. |
| 5,808,268 A | 9/1998 | Balz et al. |
| 5,821,497 A | 10/1998 | Yamazaki et al. |
| 5,829,115 A | 11/1998 | Speller, Jr. et al. |
| 5,838,431 A | 11/1998 | Hara et al. |
| 5,870,820 A | 2/1999 | Arakawa et al. |
| 5,875,544 A | 3/1999 | Chou |
| 5,909,706 A | 6/1999 | Jin et al. |
| 5,911,461 A * | 6/1999 | Sauter et al. |
| 5,932,119 A | 8/1999 | Kaplan et al. |
| 5,937,270 A | 8/1999 | Canella |
| 5,942,136 A | 8/1999 | Mori et al. |
| 5,946,791 A | 9/1999 | Baldwin |

| | | | |
|---|---|---|---|
| 5,966,307 A | 10/1999 | Lin | |
| 5,985,377 A | 11/1999 | Corbett | |
| 5,986,235 A | 11/1999 | Canella | |
| 5,991,245 A | * 11/1999 | Yoshimura | |
| 5,999,252 A | 12/1999 | Greisz | |
| 6,008,476 A | 12/1999 | Neiconi et al. | |
| 6,023,042 A | 2/2000 | Hensel et al. | |
| 6,031,202 A | 2/2000 | Arakawa et al. | |
| 6,062,119 A | 5/2000 | Overgaard | |
| 6,070,731 A | 6/2000 | Kobayashi et al. | |
| 6,138,542 A | 10/2000 | Overgaard | |

FOREIGN PATENT DOCUMENTS

| | | |
|---|---|---|
| JP | 57-53955 | 3/1982 |
| JP | 61-297047 | 12/1986 |
| JP | 62-244591 | 10/1987 |
| JP | 63171714 | 7/1988 |
| JP | 63-202521 | 8/1988 |
| JP | 1-100677 | 4/1989 |
| JP | 2-205281 | 8/1990 |
| JP | 466416 | 3/1992 |
| JP | 5-69164 | 3/1993 |
| JP | 6-226472 | 8/1994 |
| JP | 06314899 A | 11/1994 |
| JP | 6-326203 | 11/1994 |

OTHER PUBLICATIONS

Pending Patent Application "Method of Efficiently Laser Marking Singulated Semiconductor Devices" (without claims or abstract), Ser. No. 08/590,919, filed Jan. 24, 1996.

Pending Patent Application, "Shuttle Assembly for Tray Handling" (without claims or abstract), Serial. No. 09/219,501, filed Dec. 21, 1998.

Pending Patent Application, "Controlled Motion Lift Mechanism" (without claims or abstract), Serial No. 09/217,032, filed Dec. 21, 1998.

Pending Patent Application, "Self–Aligning Tray Carrier Apparatus with Tilt Feature" (without claims or abstract), Ser. No. 09/217,029, filed Dec. 21, 1998.

* cited by examiner

LASER MARKING SYSTEM FOR DICE CARRIED IN TRAYS AND METHOD OF OPERATION

CROSS-REFERENCE TO RELATED APPLICATIONS

This application is related to U.S. applications Ser. No. 09/219,501, now U.S. Pat. No. 6,241,459, Ser. No. 09/217,032, now U.S. Pat. No. 6,244,569, Ser. No. 09/217.029, now U.S. Pat. No. 6,287,029, and Ser. No. 09/217,039, now U.S. Pat. No. 6,262,388, by the same inventors, filed on even date herewith.

BACKGROUND OF THE INVENTION

This invention relates generally to marking of semiconductor dice bearing integrated circuits (ICs) and, more specifically, to a system for laser-marking exterior surfaces of dice carried in large groups on trays and a method of system operation.

Since the first packaged integrated circuits (ICs) became commercially available, manufacturers have often found it necessary to identify packaged ICs by marking each IC or packaged assembly of ICs with the manufacturer's name, a part or serial number, or other identifying information such as a lot number or a wafer and/or die location. As the majority of ICs are packaged individually in a transfer-molded filled polymer compound, most current marking systems have been developed for this type of IC packaging.

Manufacturers initially marked packaged ICs using mechanical ink transferring devices, such as stamps or rollers, with or without stencils, to transfer ink to the surface of an IC. One example of an ink-marking apparatus is disclosed in U.S. Pat. No. 5,226,361 to Grant et al. Because of the mechanical nature of the process and the drying time associated with ink, ink stamping systems are relatively slow and the applied ink susceptible to smudging. Also, the quality of ink-stamped marks on packaged ICs can vary substantially over time and from IC to IC due to variations in the quality and quantity of ink applied, ambient temperature and humidity, and the condition and finish of the surface of the stamp and the package.

Because of the deficiencies associated with ink stamping, manufacturers have in recent years switched to using a laser beam to mark the surface of a packaged IC. Unlike ink stamping, laser marking is very fast, requires no curing time, produces a consistently high quality mark, and can take place at any point in the manufacturing process.

Various machines and methods have been developed for marking ICs with a laser. As illustrated in U.S. Pat. No. 5,357,077 to Tsuruta, U.S. Pat. No. 4,945,204 to Nakamura et al., U.S. Pat. No. 4,638,144 to Latta, Jr., and U.S. Pat. No. 4,375,025 to Carlson, a packaged IC is placed in a position where a laser beam, such as that produced by a carbon dioxide or neodymium-yttrium-aluminum garnet laser, inscribes various characters or other information on a package surface. The laser beam burns away a small amount of material on the surface of the IC package so that the area where the characters are to appear has a different reflectivity from the rest of the package surface. By holding the packaged IC at a proper angle to a light source, the characters inscribed on the device by the laser can be read.

U.S. patent application Ser. No. 08/590,919 filed Jan. 24, 1996 by one of the present inventors, assigned to the assignee of the present invention and hereby incorporated herein by this reference, discloses yet another laser marking system which is operable at high throughput volumes and makes substantially constant use of a marking laser by use of a multi-track IC feed, marking and inspection procedure. While highly successful, the laser marking system of the '919 application feeds singulated, packaged ICs from tubular magazines along two parallel, inclined tracks to a marking zone, after which the marked devices are then automatically inspected and either discarded or reloaded into other tubular magazines at the output ends of the tracks.

Recently developed IC packages, however, are now much-reduced in size, thickness and dimensions of individual features, such as leads for external connection to higher-level packaging. One example of such state-of-the-art IC packages is a thin plastic package configuration identified as a Thin Small Outline Package, or TSOP. Another is a Thin Quad Flat Pack, or TQFP. By way of comparison, such packages are dimensioned with a total package thickness, excluding lead fingers, of less than about one-half the thickness of a conventional plastic Small Outline J-lead package, or SOJ, such as would be marked in the above-described system of the '919 application. These newer IC packages, with their smaller dimensions and more fragile components, are much more susceptible to inadvertent damage in handling than prior package designs and, at best, are only marginally robust enough for handling in tubular magazines and by singulated feed-through processing equipment. As a result, the industry has gravitated to processing such relatively delicate IC packages in batches carried in recesses of rectangular trays, one example of which is so-called JEDEC trays. Other, even smaller IC packages under current development and most recently introduced to the market include so-called "chip scale" IC packages. These packages, having dimensions approximating those of a bare IC die itself and employing extremely minute external connection elements, also are desirably handled in trays. It is contemplated that such chip scale packages may be desirably laser marked on the bare, or thinly coated, backside of the die itself in instances where packaging is largely intended to protect and seal the active surface at the die sides and primarily extends over the sides and active (front) surface of the die. Accordingly, as used herein, the terms "IC package", "packaged IC" or "IC" include not only conventional polymer-encapsulated dice but any dice incorporating sufficient structure to effect operative connection to a higher level package such as a circuit card, or to another die.

In addition to the aforementioned difficulties with marking thin, reduced-dimension IC packages using tubular magazines and inclined tracks, feeding and marking singulated IC packages, even when grouped for marking, are time-consuming and fraught with potential for workpiece jamming somewhere on the tracks. Further, such an approach requires numerous sensors to verify passage of individual IC packages, location of individual IC packages for marking and inspection, and counting of IC packages to ensure full output magazines, but not magazine overfilling and jamming of the handling equipment for same. Further, movable stops are required to locate and release the IC packages at numerous locations and so, along with the proliferation of sensors, necessitate a somewhat complex and relatively expensive control apparatus for reliable system operation.

Another disadvantage of conventional laser marking systems lies in a safety requirement that the IC packages be enclosed in a laser light-secure enclosure to prevent injury to personnel from the laser beam. Such conventional laser marking systems employ a workpiece path extending in a single plane through the marking station, thus requiring movable access shutters which must be manipulated, resulting in additional system cost and reducing throughput due to the time lost in opening and closing the shutters for entry and exit of groups of IC packages as well as adding another timed operation to the sequence of events in the marking process.

While trays facilitate moving large batches of packaged ICs while minimizing the risk of physical damage from handling, a problem with using trays to carry IC packages for marking is the need to deal with a wide range of tray-to-part tolerances. Thus, it would be necessary to orient the IC packages in the tray recesses to a common corner of each tray pocket to obtain a repeatable marking of all the IC packages in the tray. It would also be necessary to ensure that trays carrying IC packages are received in various handling and processing mechanisms in the correct orientation, so that the IC packages themselves will be properly oriented.

Accordingly, there is a need in the art for a mechanically and electrically straightforward, tray-based laser marking system which provides high, reliable throughput.

BRIEF SUMMARY OF THE INVENTION

The present invention includes a tray-based laser marking system providing input and output tray singulation, pin one and part in tray verification, a laser-safe enclosure housing a laser marking device, mark presence verification and consistent IC package orientation.

In one embodiment, the laser marking system of the present invention includes a tray input shuttle assembly, and a tray transport borne by a transport actuator for moving a tray carrier carrying a tray of unmarked packaged ICs received from the tray input shuttle assembly to a tray output shuttle assembly over a transport actuator path extending under an opened-bottomed enclosure of a laser marking station. The tray input shuttle, the laser marking station and the tray output shuttle each have respectively associated therewith a lift mechanism for raising and lowering a tray or the tray carrier vertically with respect to the transport so as to facilitate loading of the tray carrier with a tray from a stack of trays on the tray input shuttle assembly, insertion and withdrawal of a tray carrier bearing a tray of unmarked packaged ICs for marking within the enclosure of the laser marking station and unloading of a tray of marked IC packages from the tray carrier onto a stack of trays on the output shuttle assembly. The unloaded tray carrier is then returned on the tray transport by the transport actuator to the tray input shuttle assembly to receive another tray of unmarked packaged ICs.

In another embodiment, the present invention includes a shuttle assembly suitable for delivering trays to, or receiving trays from, a transport. The shuttle assembly is configured to manipulate trays in a vertically stacked arrangement through the use of a frame defining a rectangular tray stack volume and supporting a tray support element initiator proximate each corner of the tray stack volume. The tray support element initiators may be controlled in common, each initiator driving a tray support element which may be spring-biased toward an extended position intersecting a boundary of the tray stack volume. When a stack of trays is supported proximate its corners by location of the extended tray support elements under the lowermost tray, it may be removed from the shuttle assembly by extension of a lift structure of a lift mechanism into supporting contact under the lowermost tray, whereupon the tray support elements may be retracted, the tray stack lowered the depth or thickness of one tray, the tray support elements re-extended, and the lift structure with lowermost tray further lowered onto a tray carrier for horizontal movement by a transport actuator out from under the tray stack. Similarly, when a tray carrier bearing a tray enters a tray stack volume of a shuttle assembly, a tray may be lifted off the tray carrier into supporting contact with a lowermost tray of a stack by extension of a lift structure of a lift mechanism, the tray support elements retracted and the lifted tray with supported stack of trays lifted the depth or thickness of a single tray, the tray support elements then being re-extended to support all of the trays of the stack.

Yet another embodiment of the invention includes a wedge-type lift mechanism suitable for controlled raising and lowering of a tray or tray carrier within the horizontal boundaries of a tray stack volume. The lift mechanism includes a horizontally movable drive wedge element having an upper inclined surface and a slave wedge element having a lower inclined surface slidingly supported on the drive wedge element upper inclined surface. Horizontal movement of the slave wedge element is constrained while vertical movement is permitted, so that horizontal movement of the drive wedge element raises or lowers the slave wedge element. A lift structure extending upwardly from the slave wedge element may be employed to engage a tray supported by the tray carrier for lowering or raising one or more trays with respect to the tray carrier such as, for example, when loading or unloading trays at a shuttle. The lift mechanism is also suitable for effecting controlled vertical movement of the tray carrier off of and back onto a tray transport such as, for example, to move the tray carrier respectively into and out of an enclosure at a laser marking station.

Still another embodiment of the invention includes self-aligning, cooperative tray carrier and tray transport configurations to ensure precise, repeatable alignment of the tray carrier with the tray transport through gravity alone when a tray carrier which has been raised off the transport is again lowered into supporting contact therewith. Another, optional, feature of the mutually cooperative configurations of the tray carrier and tray transport permits the tilting of the tray carrier while still supported on the transport so as to effect precise alignment of IC packages carried in rectangular recesses on a tray on the tray carrier with respect to common alignment points (i.e., the same corner of each tray recess) to facilitate repeatability of the IC package surface location being marked on each IC package borne by the tray. Such alignment may be further enhanced by vibration or tapping of the tray carrier while in a tilted orientation.

An additional embodiment of the invention includes a laser marking station housing a laser marking head within a walled, substantially bottomless enclosure defining an opening into which a tray carrier bearing a tray of IC packages to be marked may be raised to place the tray at correct laser focal length and effect complete (laser) light containment within the enclosure using the tray carrier to effect closure of the opening.

Yet another embodiment of the invention includes a method of operation of the laser marking system of the invention.

DETAILED DESCRIPTION OF THE INVENTION

Figure 1:
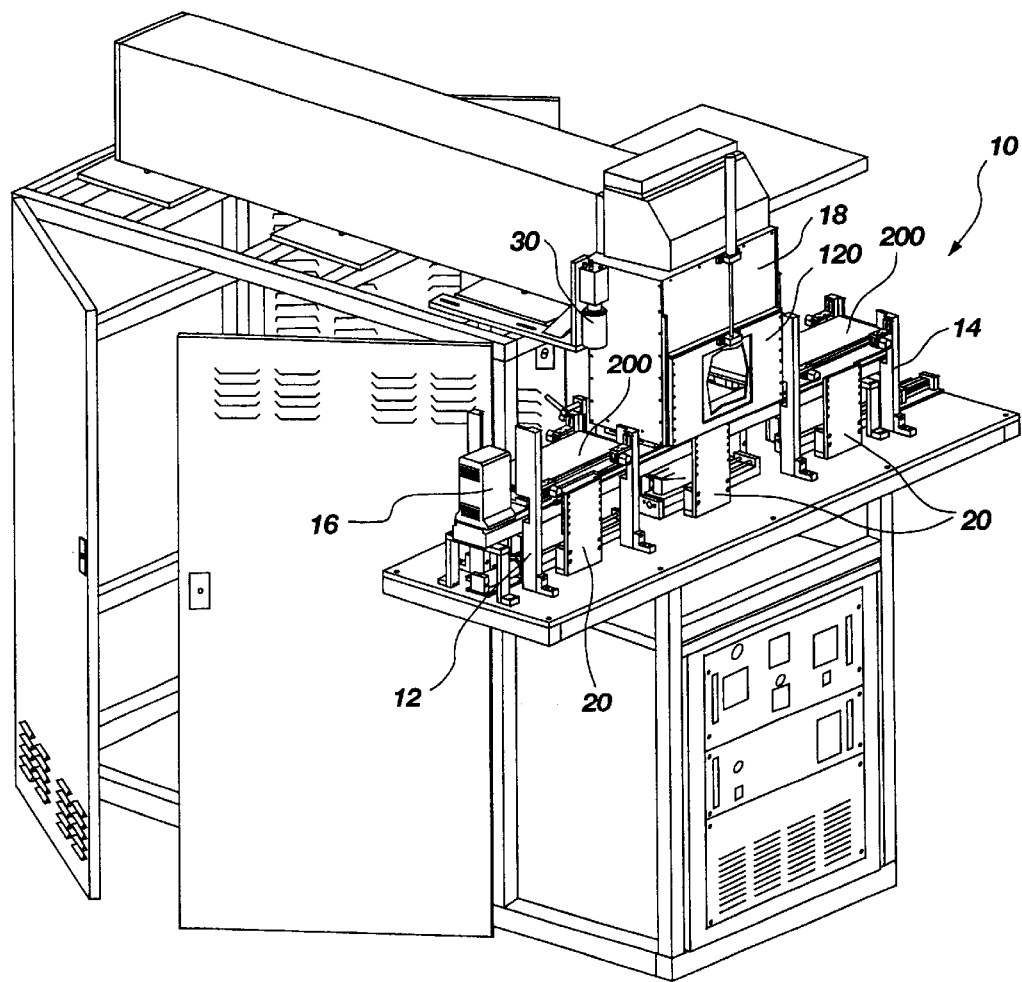
FIG. 1 of the drawings comprises a perspective view of a laser marking system according to one embodiment of the present invention.
Figure 2:
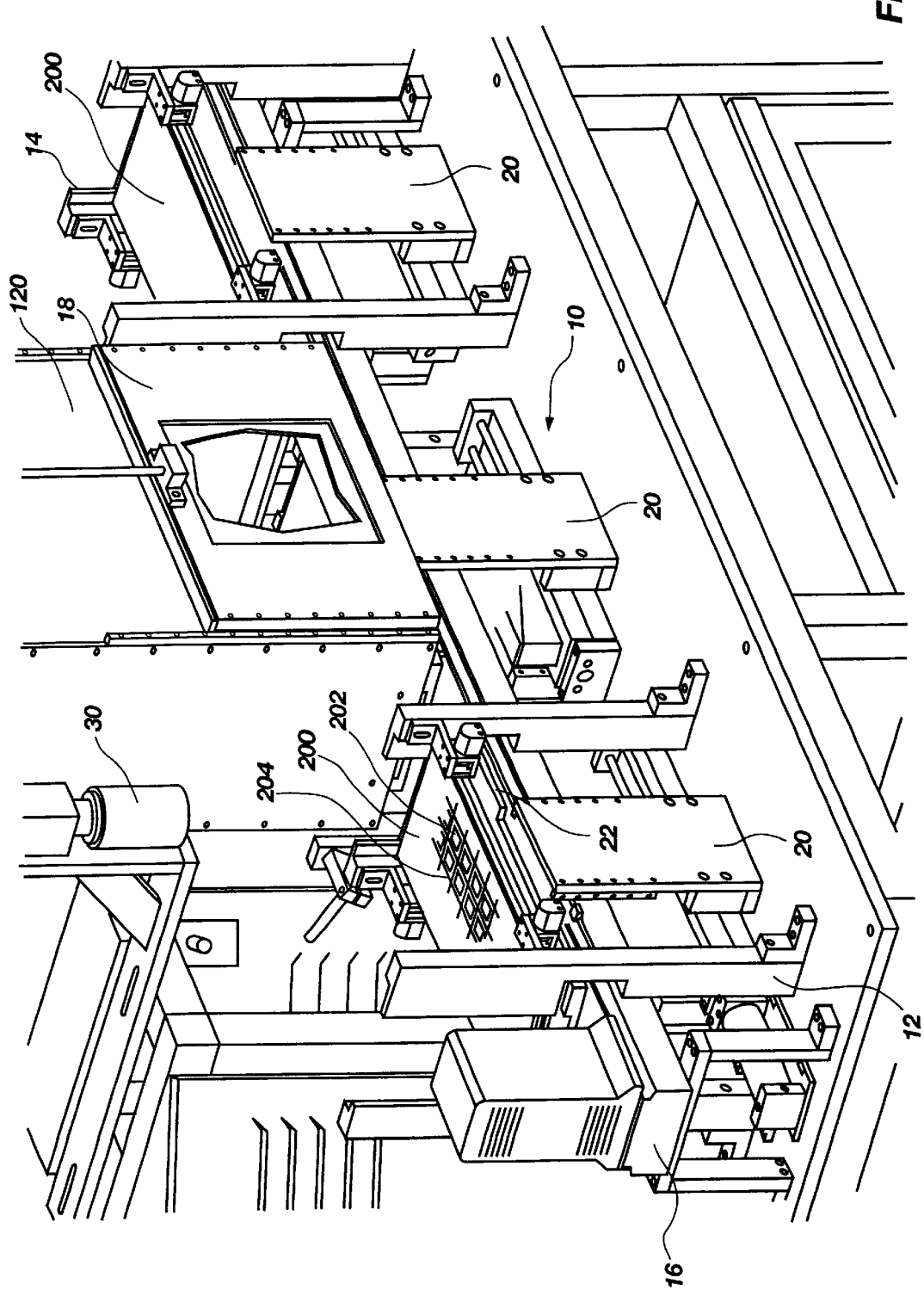
FIG. 2 comprises an enlargement of a central portion of FIG. 1.

Referring now to FIGS. 1 and 2 of the drawings, laser marking system 10 includes an input shuttle assembly 12, an output shuttle assembly 14 and a transport actuator 16 extending horizontally therebetween. The transport actuator 16 extends under laser marking station 18. Three lift mechanisms 20 are located respectively in vertical alignment with input shuttle assembly 12, laser marking station 18, and output shuttle assembly 14.

A plurality of vertically stacked trays 200 is depicted at both input shuttle assembly 12 and output shuttle assembly 14, the structure and operation of each shuttle assembly being described in more detail below. Also depicted (see FIG. 2) is tray carrier 22, on which a singulated tray 200 carrying a plurality of packaged ICs 202 (also referred to as IC packages) in a rectangular array of recesses 204 (only some shown for clarity) comprising rows and columns may be moved on a tray transport 24 (see FIGS. 4–8) of transport actuator 16 from input shuttle assembly 12 to output shuttle assembly 14. Tray transport 24 may be precisely rotationally aligned with the longitudinal path defined by transport actuator 16 using Allen-type T-nuts, which secure tray transport 24 to the carriage of transport actuator 16.

A downwardly aimed inspection camera 30 as shown on the upstream side of laser marking station 18 may be employed to verify pin one location and thus proper orientation for the packaged ICs 202 in a tray 200 passing thereunder on tray carrier 22, as well as part in tray verification to ensure that each tray 200 is fully loaded with packaged ICs 202 for marking. A similar camera 30 on the downstream side of laser marking station 18 may be employed to verify the presence of laser markings on each packaged IC 202 of a tray 200 which has been processed in laser marking station 18. A tray 200 is preferably stopped twice (and moved a half-tray length between stops) under downstream camera 30 for mark inspection, as packaged ICs 202 in each longitudinal half of each tray 200 are substantially concurrently marked in a separate laser field by a different, separately (different circuit) controlled laser head of laser marking station 18. Most preferably, marking of the last IC package in each field is checked on the logical premise that satisfactory marking of the last package would not take place if any failure in the laser or beam control circuitry had previously occurred. This sampling approach to inspection achieves the required quality assurance for the marking process with a substantial time savings over inspecting every marked IC package. High-intensity lights (not shown) may be provided at the two camera locations to facilitate inspection.

Transport actuator 16 preferably comprises an IAI Corporation Model 12EX-35-100 Intelligent Actuator, a 1000 mm programmable stepper. Transport actuator 16 may be programmed (by way of example only and not limitation) for use with laser marking system 10 to six (6) positions: tray input, tray check (pin one location and tray full load verification), marking, dual mark check (one for each half of the tray, as described above) and tray output. This particular approach to transporting a tray carrier 22 was selected due to the precise longitudinal positional accuracy provided at each position. Other, alternative approaches to tray transport providing equivalent positional accuracy may be employed instead.

Figure 3:
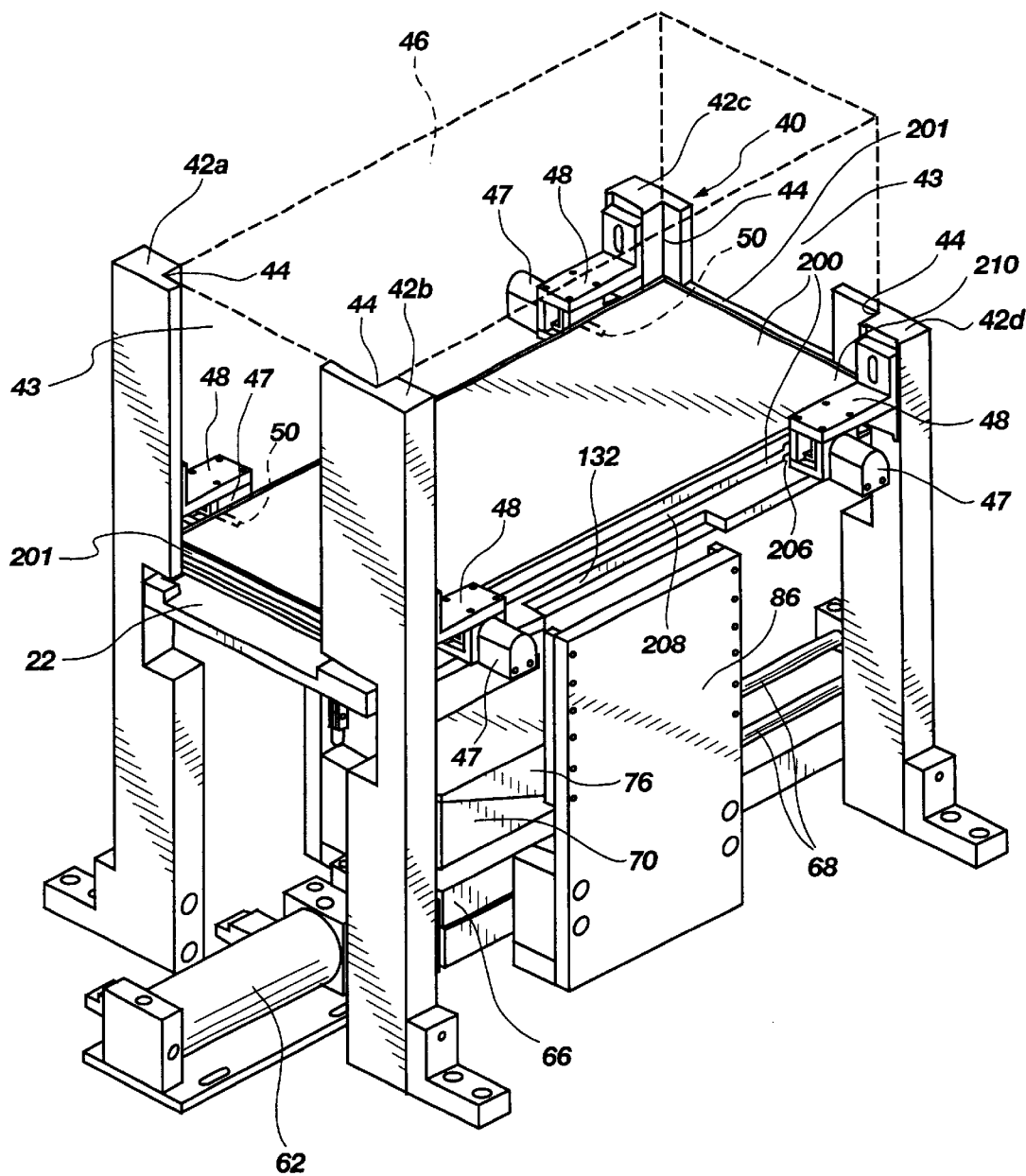
FIG. 3 is an enlarged perspective view of a tray shuttle according to one embodiment of the present invention.
Figure 4:
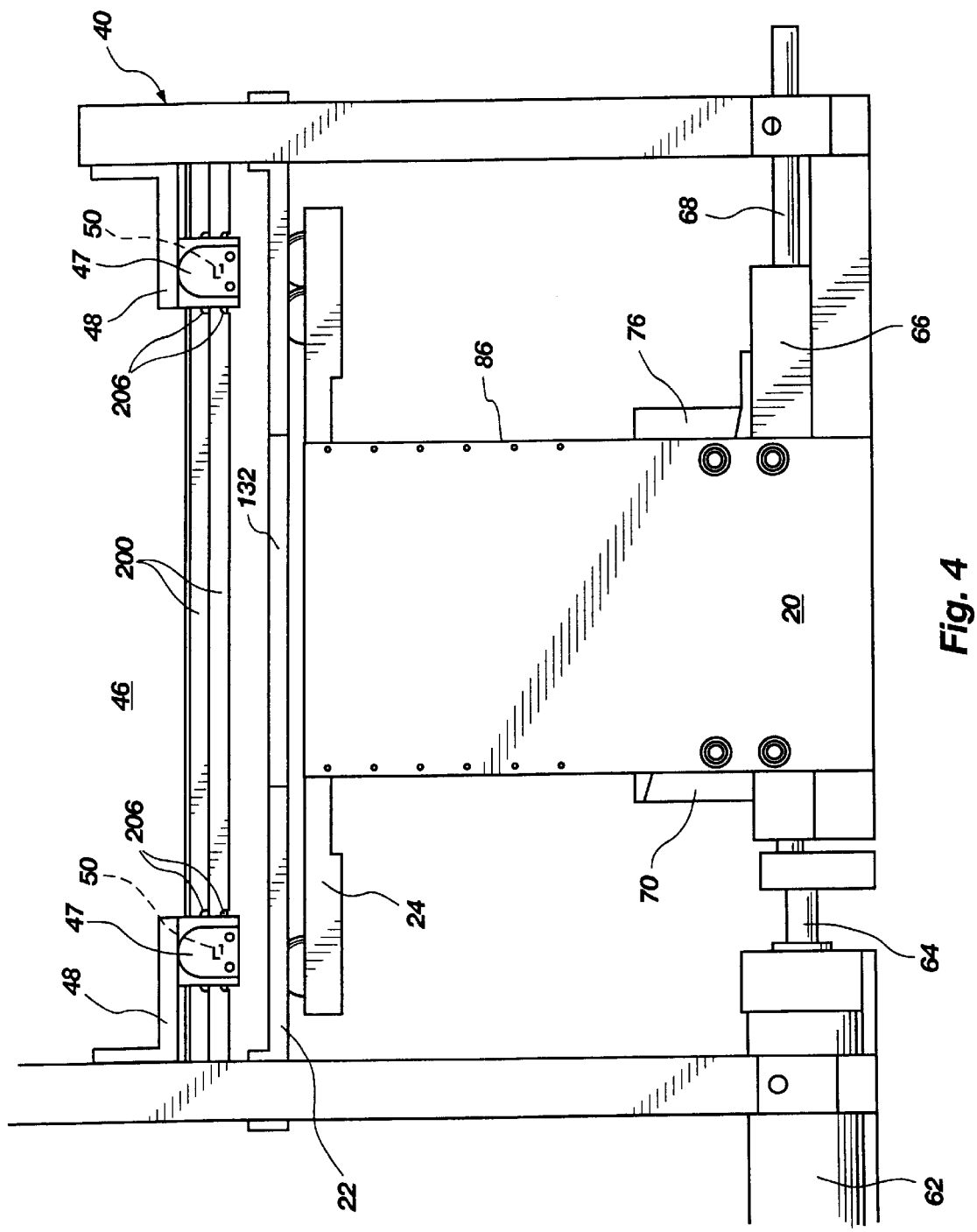
FIGS. 4–6 are side elevations of the tray shuttle assembly of FIG. 3 in various positions.
Figure 5:
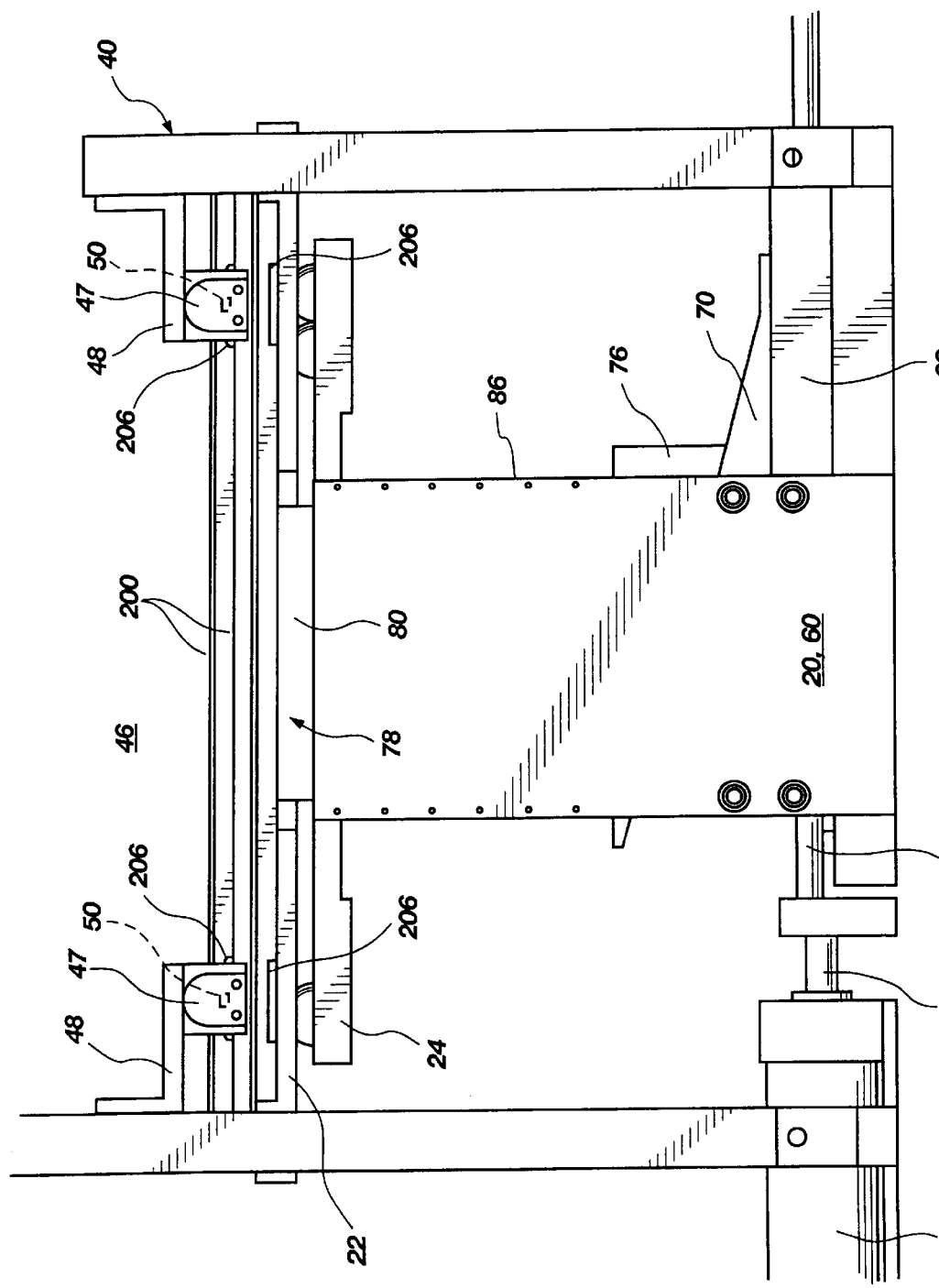
Figure 6:
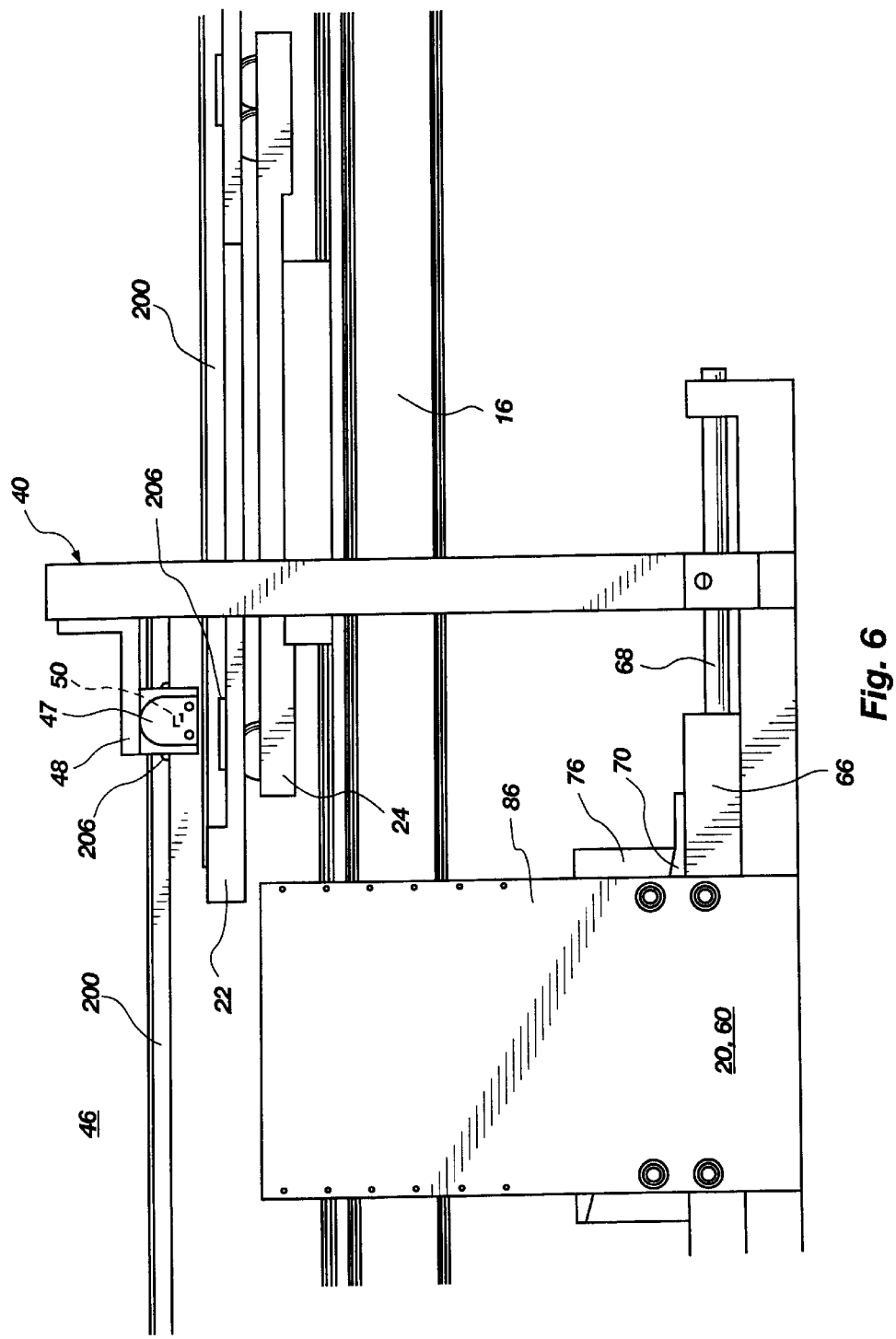

Input shuttle assembly 12 and output shuttle assembly 14 as depicted in FIGS. 1 and 2 are substantially identical. FIG. 3 shows an enlargement of the portion of FIG. 2 depicting input shuttle assembly 12, and with transport actuator 16 removed for clarity. Input shuttle assembly 12 includes a frame 40 comprising four frame members 42a–d, each having a vertically extending notch 44 facing a rectangular tray stack volume 46 shown in broken lines. Frame members 42a and 42b extend upwardly a greater distance than frame members 42c and 42d, and define the uppermost preferred vertical height limit for a stack of trays 200, two of which trays 200 being shown. As can readily be seen in FIG. 3, a distance or depth from a corner of tray stack volume 46 defined by a notch 44 to a laterally inward edge of each of frame members 42a and 42c is smaller than a distance or depth from a corner of tray stack volume 46 defined by notch 44 to a laterally inward edge of each of frame members 42b and 42d. Further, there is a laterally extending gap 43 between frame members 42a and 42b, and a like-sized gap 43 between frame members 42c and 42d. Protrusions 201 at each end of trays 200 are sized and located on each end of the trays 200 to lie within gaps 43 when a tray 200 is located in tray stack volume 46 so that the input shuttle assembly 12 is "keyed" to only accept trays 200 in the proper rotational orientation. In other words, the frame will not accept a tray 200 placed "backward" in tray stack volume 46. Thus, the packaged ICs 202 in each tray 200 will be in a proper orientation for marking. Each frame member 42a–d supports a tray support element actuator 47 on a height-adjustable bracket 48. Tray support element actuators 47 preferably comprise air (pneumatic) cylinders which, when actuated, retract a tab-like tray support element 50 which is otherwise spring-biased inwardly to intersect a boundary of tray stack volume 46, the tray support elements 50 each being located in their extended positions to enter one of four downwardly facing notches 206 in the side 208 of a tray 200 proximate a tray corner 210. Thus, one or more trays 200 may be supported at four locations within tray stack volume 46. Further, if air pressure to tray support element actuators 47 is lost, any trays 200 within tray stack volume 46 above tray support elements 50 are kept from falling. Tray support element actuators 47 may comprise Myotoku Ltd. TKY-H-8X4 air cylinders. Tray carrier 22 is depicted under tray stack volume 46 in FIG. 3 in position to receive a tray 200 lowered thereon. FIGS. 4–6 depict a tray unload sequence, wherein (FIG. 4) a tray transport 24 bearing a tray carrier 22 is located initially under tray stack volume 46 of input shuttle assembly 12 out of contact with lowermost tray 200, and parallel side plates 80 of a lift structure 78 (FIG. 5) of a wedge-type lift mechanism 60 as described below are vertically extended through elongated side notches 132 of tray carrier 22 to supportingly engage the bottom of lowermost tray 200 and support all of the trays in tray stack volume 46. At this point, tray support element actuators 47 are initiated to withdraw tray support elements 50. In FIG. 5, lowermost tray 200 has been lowered on side plates 80 of lift structure 78 a vertical distance (for example, 0.25 inch) equal to the thickness of each tray 200, tray support element actuators 47 deactivated to extend tray support elements 50 into downwardly facing notches 206 of the next highest tray 200, and then lowermost tray 200 further lowered onto tray carrier 22. Tray carrier 22 carrying lowermost tray 200 is then moved horizontally out from under tray stack volume 46 on tray carrier 22 and tray transport 24 as shown in FIG. 6 and toward laser marking station 18.

In unloading trays 200 from tray carrier 22 at output shuttle assembly 14 after passage through laser marking station 18, side plates 80 of a lift structure 78 of a wedge-type lift mechanism 60 are vertically extended through elongated side notches 132 of a tray carrier 22 aligned with the tray stack volume 46 of output shuttle assembly 14 and carrying a tray 200 of marked packaged ICs 202 to raise that tray 200 into supporting contact with a lowermost (or only) tray 200 already in tray stack volume 46 and supported by tray support elements 50 of output shuttle assembly 14. Tray support element actuators 47 are then initiated to retract tray support elements 50, the stack of trays 200 lifted the thickness of one tray 200 (again, for example, 0.25 inch), and tray support element actuators 47 deactivated to extend tray support elements 50 into downwardly facing notches 206 of the lowermost tray 200 just lifted from tray carrier 22 and support the stack of trays 200. Of course, if there are no trays at output shuttle assembly 14 when a tray carrier 22 bearing a tray 200 arrives, the sequence will be the same. After side plates 80 are vertically withdrawn below the level of tray carrier 22 on tray transport 24, tray carrier 22 is returned on tray transport 24 to input shuttle assembly 12 to receive another tray 200 of unmarked packaged ICs 202.

Figure 7:
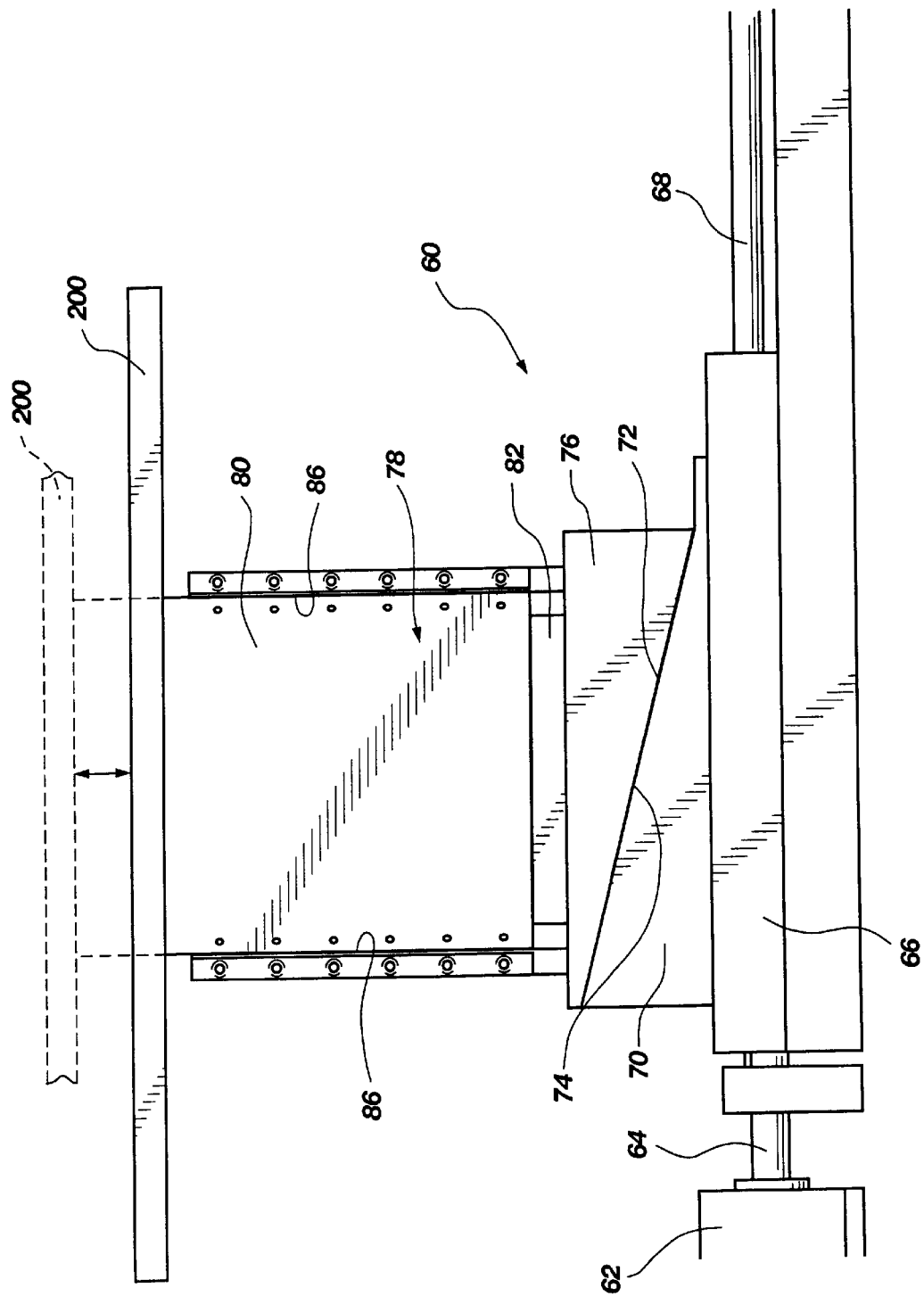
FIGS. 7–9 are side, partial sectional elevations of a wedge-type lift mechanism according to one embodiment of the present invention in various positions.
Figure 8:
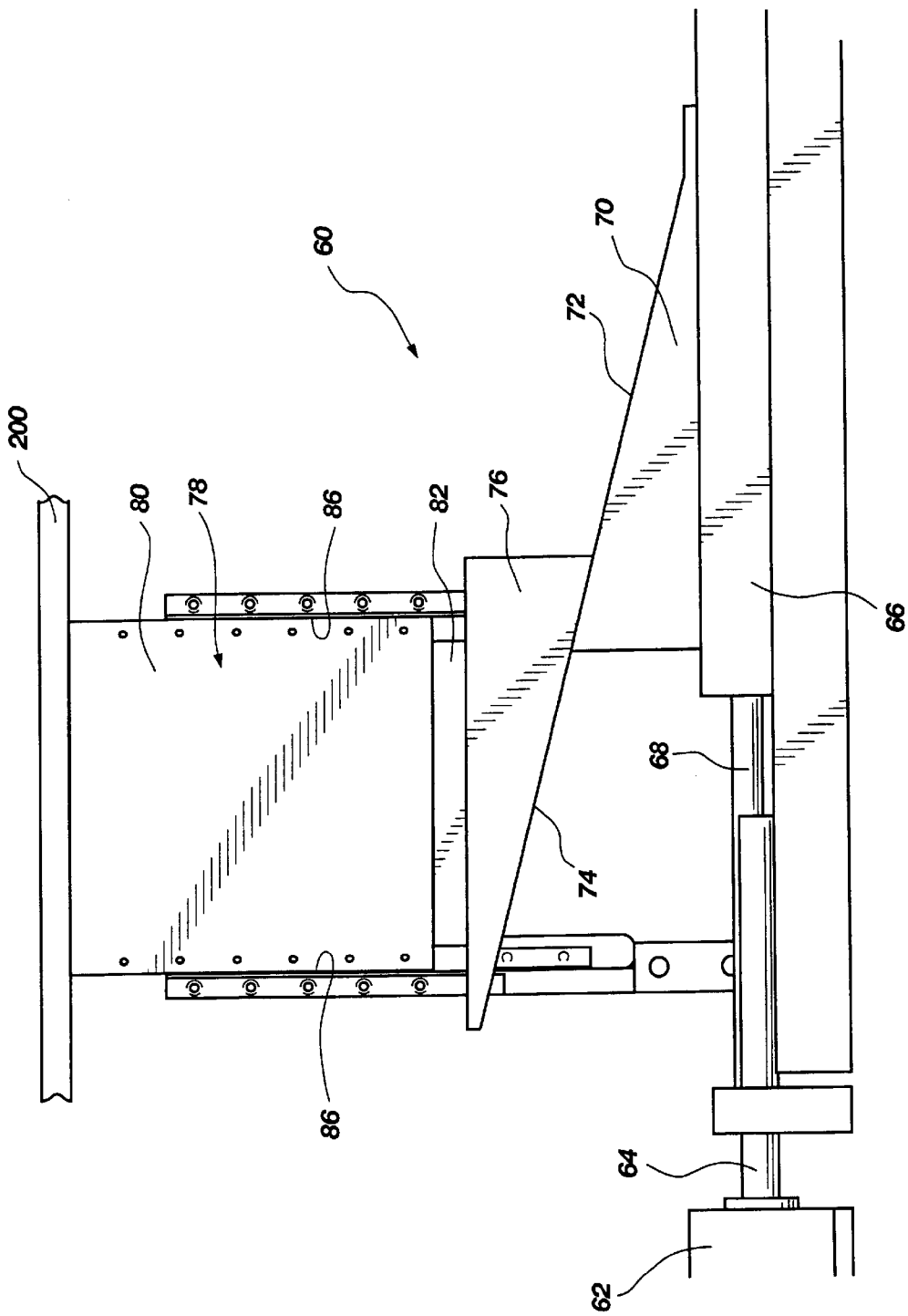
Figure 9:
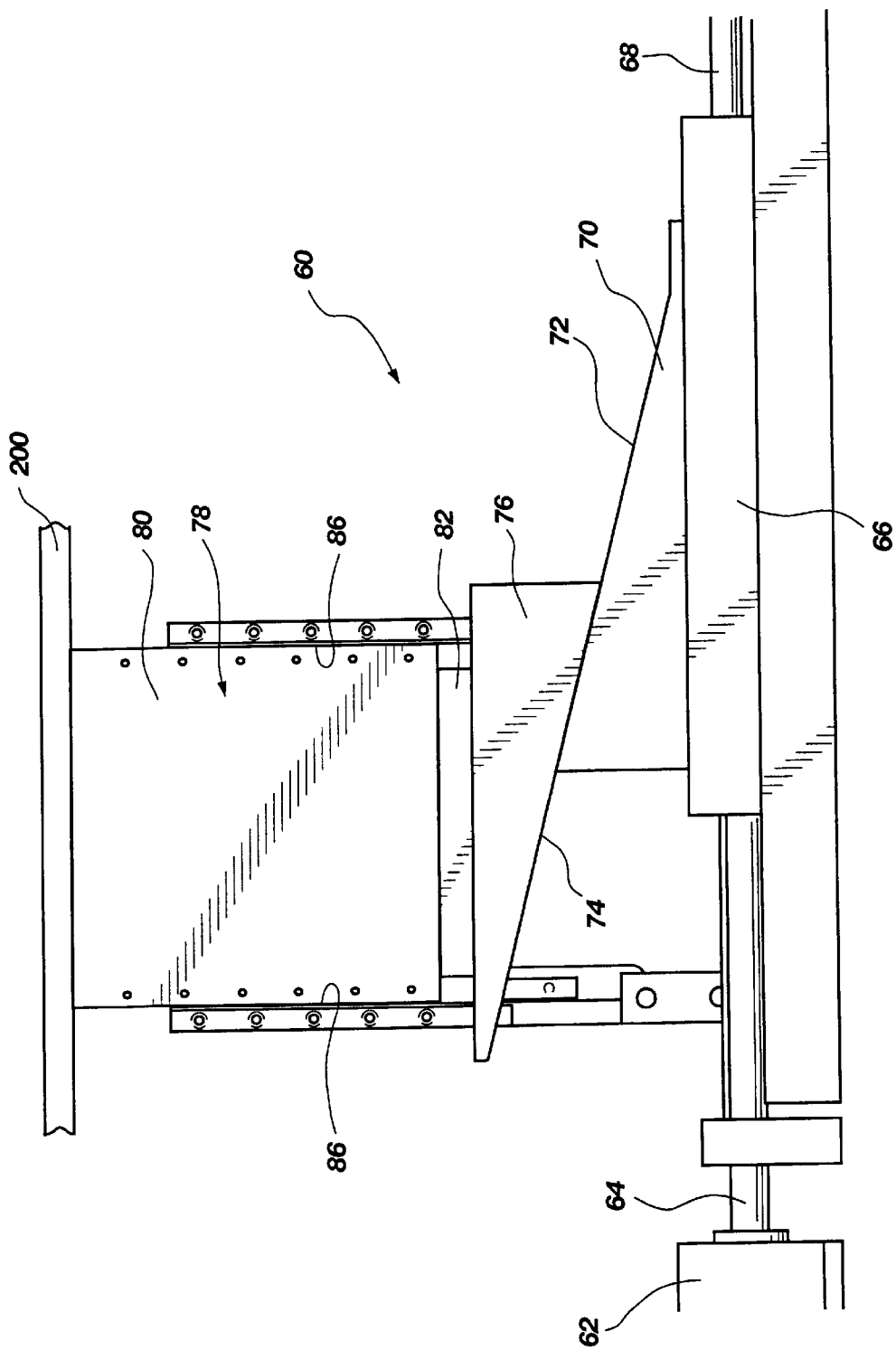

A significant feature of the laser marking system 10 is a particular wedge-type lift mechanism 60 (located as noted by reference numerals 20 on the previously referenced drawing figures) as depicted in various positions in FIGS. 7–9. In the preferred embodiment, lift mechanism 60 is employed with input shuttle assembly 12, output shuttle assembly 14 and laser marking station 18. Lift mechanism 60 includes a horizontally oriented stop dual-action (i.e., positive bidirectional actuation) air cylinder 62, which may comprise a Parker Series S pneumatic cylinder. Shaft 64 of cylinder 62 is extendable and retractable under air pressure to selectively provide a stop for dual-action, pneumatically actuated drive block 66 riding on dual parallel horizontal guide shafts 68. Drive wedge element 70 carried on drive block 66 and secured thereto has an upper inclined surface 72 upon which is supported lower inclined surface 74 of slave wedge element 76. Slave wedge element 76 is constrained against horizontal movement by attachment to a three-sided lift structure 78 comprising vertically extending side plates 80 and horizontal floor 82, side plates 80 being contained and guided by linear bearings 86 so as to permit only vertical movement. As drive block 66 moves horizontally, such movement is translated into vertical movement of the lift structure 78 by movement of the inclined upper surface 72 of drive wedge element 70 against lower inclined surface 74 of slave wedge element 76. Due to the angle of inclination of surfaces 72 and 74, horizontal motion results in reduced vertical motion (by, for example, a 4:1 horizontal to vertical ratio) but increased force over the smaller vertical distance as well as a smoother vertical movement of lift structure 78, reducing any shock of contact of lift structure 78 with a tray 200. Furthermore, the control system for the lift mechanism 60, since it involves control of only two dual-action air cylinders, is extremely simple compared to conventional stepper or servo controls. In the preferred embodiment, the lift mechanism 60 with air cylinder 62 and drive block 66 may be manipulated to move in a vertical increment equal to the thickness of trays 200, as alluded to above. Such manipulation is possible due to the difference in travel between shaft 64 of air cylinder 62, which may be either three inches or one inch in the disclosed embodiment as explained below, and drive block 66, which is four inches in the disclosed embodiment. Further, air cylinder 62 is sized to generate substantially more force than drive block 66, so that actuation of air cylinder 62 in opposition to drive block 66 precludes further movement of drive block 66 upon contact with shaft 64. Stated alternatively, the shaft 64 of air cylinder 62 may be selectively extended to act as a stop to full horizontal travel of drive block 66 and thus provide lift mechanism 60 with a vertical position between fully extended and fully retracted.

The uppermost vertical position of lift structure 78 of the lift mechanism 60 may obviously be designed in light of the level to which a tray 200 must be lifted. For example, when used with both input shuttle assembly 12 and output shuttle assembly 14, the uppermost vertical position of lift structure 78 (in this instance, 1.00 inch elevation) would be in supporting contact with the lowermost tray 200 in tray stack volume 46. When used with input shuttle assembly 12, the uppermost vertical position is used to supportingly engage the lowermost tray in tray stack volume 46 and support it to permit retraction of tray support elements 50. When used with output shuttle assembly 14, the uppermost vertical position of lift structure 78 would be the same (1.00 inch) as for input shuttle assembly 12, that is, one tray thickness (i.e., 0.25 inch) higher than the bottom of the lowermost tray 200 in the tray stack volume, so that a tray 200 full of marked IC packages 202 may be raised into lifting contact with the lowermost tray of a stack (or, stated another way, so that notches 206 of the tray 200 being lifted by the lift structure 78 are above the tray support elements 50) so that the tray 200 being lifted from the tray carrier 22 (and trays 200 thereabove in the stack) may be supported by extended tray support elements 50 Thus, tray transport 24 with tray carrier 22 may be returned to input shuttle assembly 12 to receive another tray 200. When used with laser marking station 18, the uppermost vertical position of lift structure 78 is also the same (1.00 inch) and is employed to place a tray 200 on tray carrier 22 within a substantially bottomless, laser light safe enclosure, as will be described in more detail below.

Figure 17A:
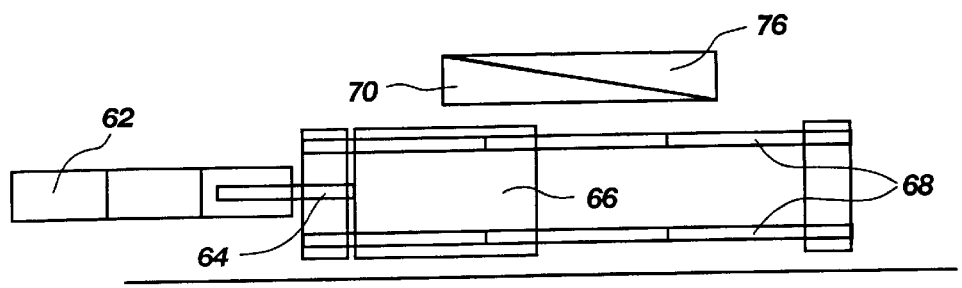
FIGS. 17A–D are schematic representations of tray input cycle positions of a wedge-type lift mechanism according to one embodiment of the invention.
Figure 17B:
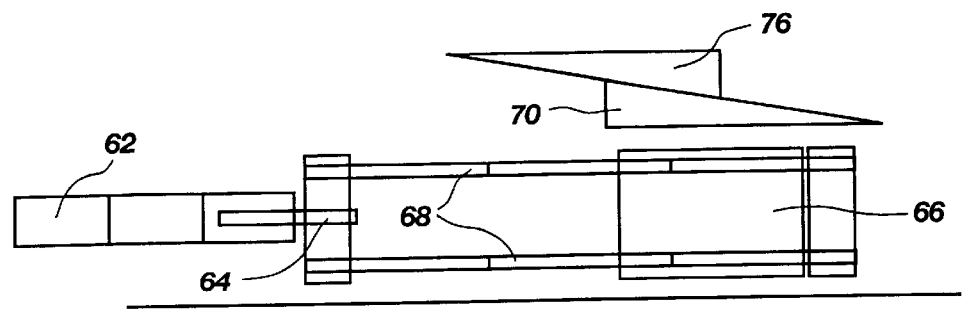
Figure 17C:
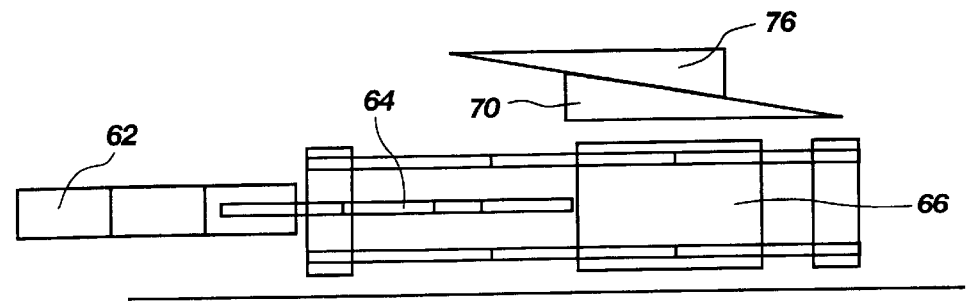
Figure 17D:
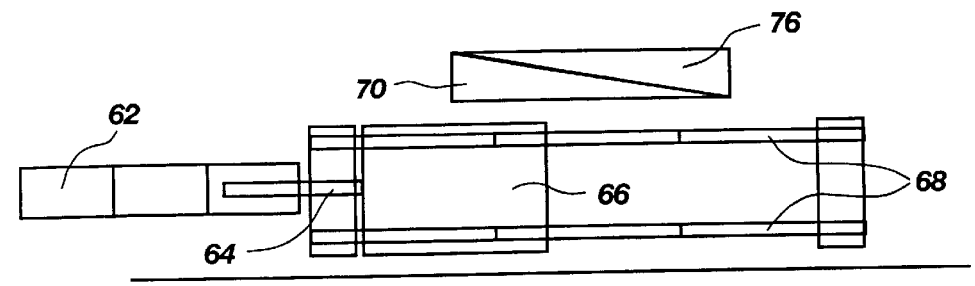

As shown in FIGS. 7–9 with specific reference to a lift mechanism for an input shuttle assembly 12, lift mechanism 60 as described may be programmed to one of several vertical positions over a total travel of 1.00 inch, including a zero elevation position wherein lift structure 78 is completely retracted out of contact with a tray 200 when the latter rests on tray carrier 22 on tray transport 24 carried by transport actuator 16. For example, and with specific reference to FIG. 7, the lowermost vertical position of lift mechanism 60 (and therefore of lift structure 78) is achieved when air cylinder 62 is actuated to withdraw shaft 64 to the left as shown in the drawing figure, while drive block 66 is similarly moved to the left so that slave wedge element 76 is substantially superimposed over drive wedge element 70. In order to raise lift structure 78 to its uppermost vertical position as shown in FIG. 8 to, for example, receive a tray 200 from input shuttle assembly 12, drive block 66 is actuated to move its full horizontal travel (four inches) to the right, yielding 1.00 inch of lift travel. At the same time, or subsequently, air cylinder 62 may be actuated to drive shaft 64 its full horizontal travel (three inches) to the right in preparation for the next movement sequence of lift mechanism 60. After tray 200 at the bottom of a tray stack in input shuttle assembly 12 is contacted by side plates 80 of lift structure 78 and tray support elements 50 retracted as previously described, drive block 66 is positively actuated to move to the left. However, contact with extended shaft 64' of air cylinder 62 as shown in FIG. 9 prevents further, leftward movement of drive block 66, resulting in a downward vertical movement of lift structure 78 of only 0.25 inch (one inch of horizontal travel of drive block 66 being reduced by a 1 to 4 ratio due to the angle of inclination of like-angled inclined surfaces 72 and 74) to a 0.75 inch elevation. At this point, tray support elements 50 are again extended to support the next-lowermost tray 200 in the stack as shown in FIG. 5, and air cylinder 62 may then be actuated to positively drive shaft 64 to the left, followed by leftward movement of already-actuated drive block 66 to return lift structure 78 to its lowermost position as shown in FIG. 7. A complete tray input cycle sequence of positions of drive wedge element 70, slave wedge element 76, shaft 64 and drive block 66 of a wedge-type lift mechanism 60 usable with an input shuttle assembly 12 according to one embodiment of the present invention is schematically depicted in FIGS. 17A–17D. Lift mechanism 60 moves from its lowermost position (FIG. 17A) to its uppermost elevation of 1.00 inch (FIG. 17B), moves downward 0.25 inch to a 0.75 inch elevation (FIG. 17C) and then moves back to its lowermost position (FIG. 17D).

It should be noted that, while the elements of wedge-type lift mechanism 60 are the same when used with both input shuttle assembly 12 and output shuttle assembly 14, air cylinder 62 is reversed in orientation due to space considerations and the travel of shaft 64 extending therefrom is abbreviated, as explained further below.

Figure 18A:
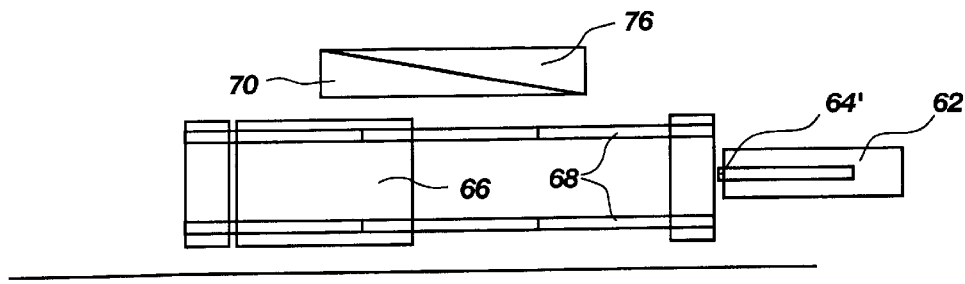
FIGS. 18A–D are schematic representations of tray output cycle positions of a wedge-type lift mechanism according to one embodiment of the present invention.
Figure 18B:
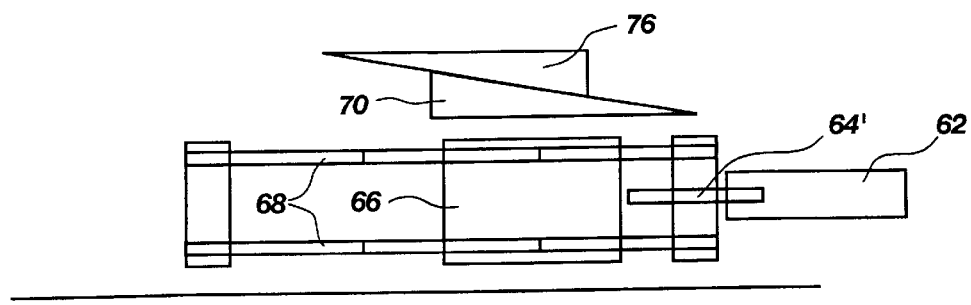
Figure 18C:
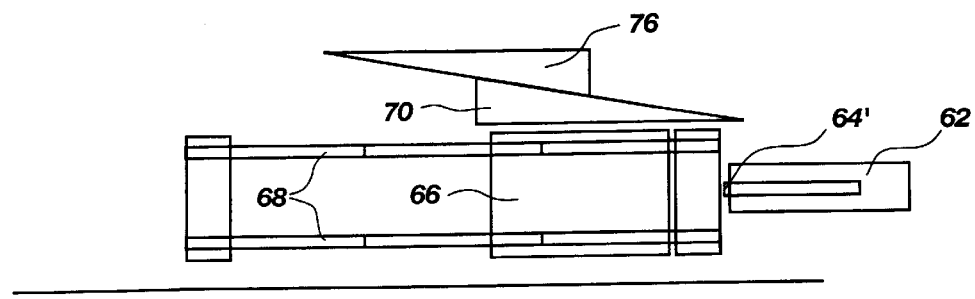
Figure 18D:
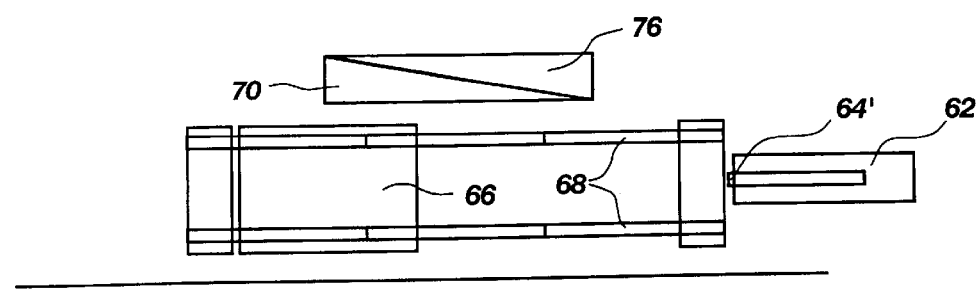

When lift mechanism 60 is employed with output shuttle assembly 14, the initial raised position of lift structure 78 is at 0.75 inch, wherein the bottom of a stack of trays 200 is contacted in supporting relationship by a tray 200 of marked IC packages 202. Then, tray support elements 50 are retracted to permit lift structure 78 movement to full vertical travel of 1.00 inch to lift the tray stack upwardly one tray thickness so that tray support elements 50 may be extended to support the stack by the newly added lowermost tray 200 just received from tray carrier 22. A complete tray output cycle sequence of positions of drive wedge element 70, slave wedge element 76, shaft 64 and drive block 66 of a wedge-type lift mechanism 60 usable with an output shuttle assembly 14 according to one embodiment of the present invention is schematically depicted in FIGS. 18A–18D. As depicted in FIGS. 18A–18D, when used with an output shuttle assembly 14, the lift mechanism 60 moves from a lowermost position (FIG. 18A) to a 0.75 inch elevation position (FIG. 18B), wherein drive block 66 has moved from left to right, but its travel has been halted by contact with extended shaft 64' of air cylinder 62, in this instance, placed to the right of drive block 66 rather than to the left. Since shaft 64', when extended, only travels one inch, the travel of drive block 66 to the right is halted at the 0.75 inch elevation of lift mechanism 60. Shaft 64' is then retracted to the right, followed by drive block 66, causing lift mechanism 60 to reach its full vertical travel of 1.00 inch (FIG. 18C). Drive block 66 is then moved to the left (FIG. 18D).

It may be desirable to include sensors in lift mechanism 60 to detect positions of drive block 66 and shaft 64 or 64'. For example, drive block position may be sensed using magnetic proximity sensors, while the extension or retraction of shaft 64 or 64' may be inductively sensed. Other types of sensors, for example, optical sensors or contact switches, might also be employed in this capacity.

In use with laser marking station 18, only drive block 66 is required in lift mechanism 60, since only two vertical positions are required. The first position of lift structure 78 corresponds to that shown in FIG. 7, while the second, full vertical extension position of lift structure 78 corresponds to that shown in FIG. 8. The second position extends a tray carrier 22 bearing a tray 200 into enclosure 120 (FIGS. 1,2,15 and 16) of laser marking station 18 as will be more fully described below.

Figure 10:
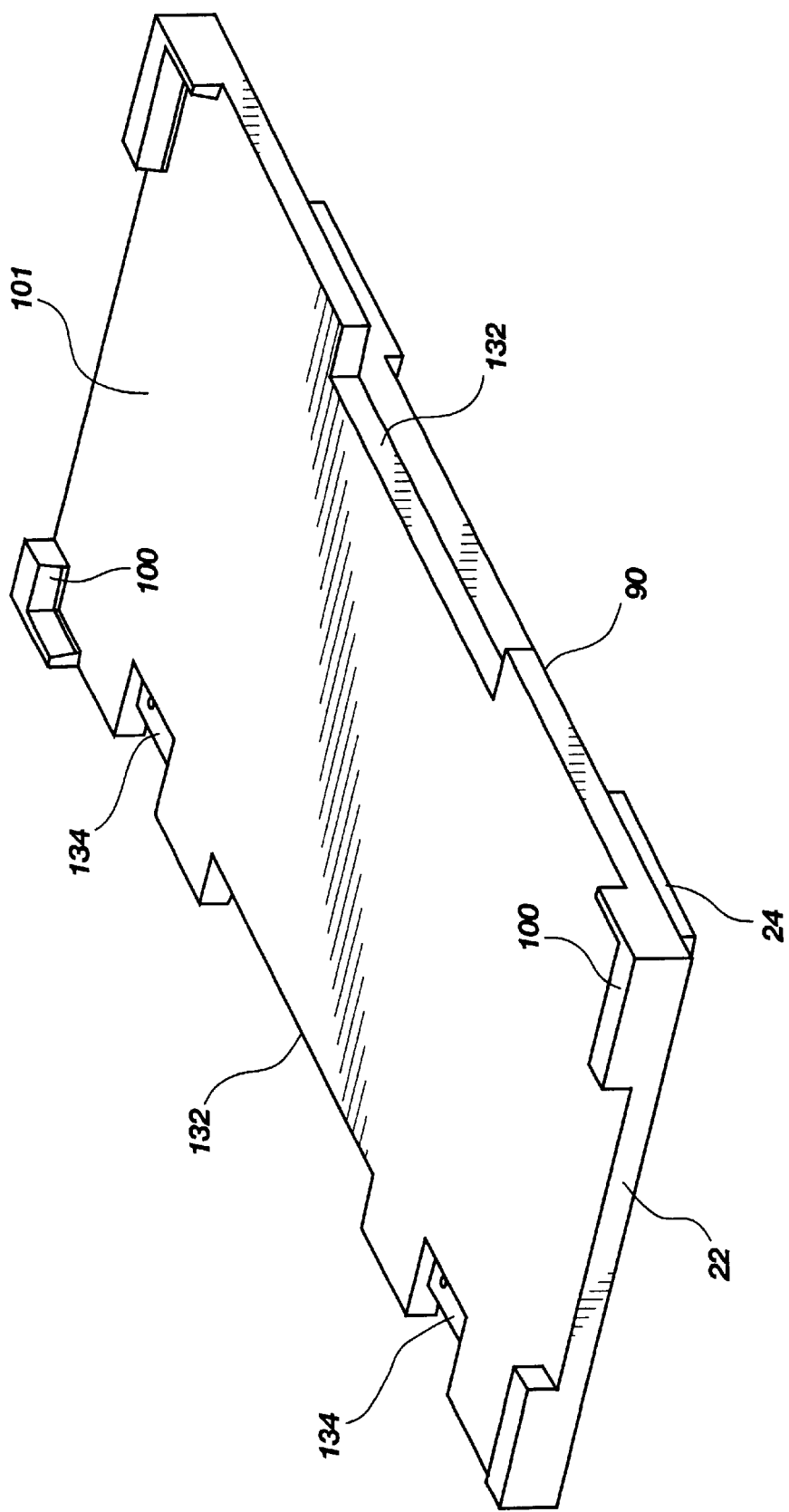
FIG. 10 is a top perspective view of a tray carrier and cooperating tray transport according to one embodiment of the present invention.
Figure 11:
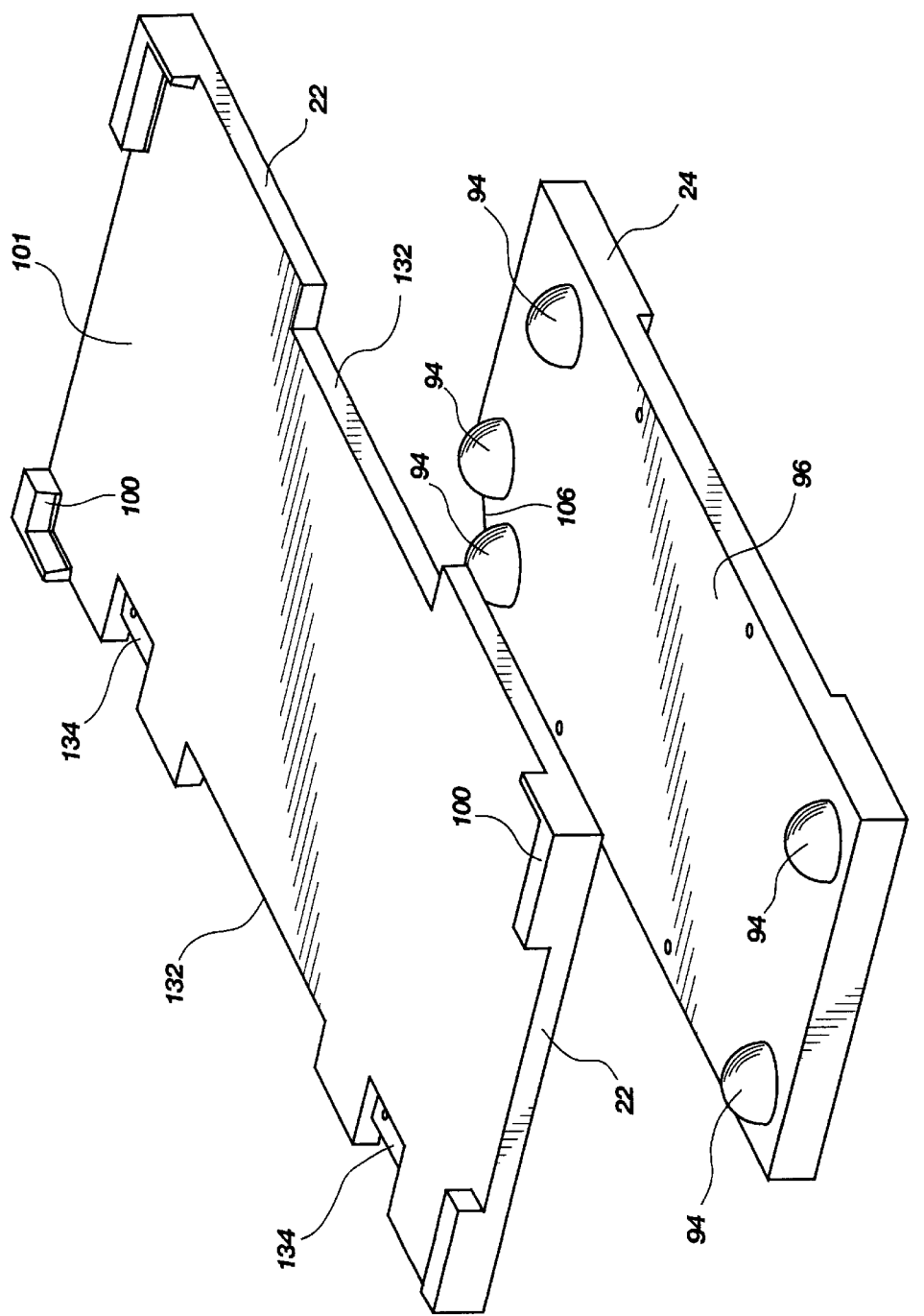
FIG. 11 is a vertically exploded view of FIG. 10.

Yet another significant feature (see FIGS. 10–12) is a self-aligning, cooperative configuration of tray carrier 22 and tray transport 24 to ensure repeatable, precise positioning of a tray 200 borne by the tray carrier 22 with respect to input and output tray stack volumes 46 and laser marking station 18. As noted previously, tray carrier 22 is lifted off of tray transport 24 by a lift structure 78 into the substantially bottomless enclosure 120 of laser marking station 18 and then returned therefrom for transport to output shuttle assembly 14. It is imperative that tray carrier 22 be in a precise location and position when lifted from tray transport 24 and that it be returned to the same, precise location for reliable tray movement, to maintain the integrity of parts on the tray, and to ensure trouble-free operation when unloading and loading trays 200 at shuttle assemblies 12 and 14. This precise orientational requirement, moreover, must be accommodated without physical connection of the tray carrier 22 to tray transport 24. Therefore, the substantially planar lower surface 90 of tray carrier 22 is provided with a plurality of hemispherical recesses 92 which are of like radius and in the same positions as hemispherical bearings 94 projecting upwardly from substantially planar upper surface 96 of tray transport 24. This cooperative recess and bearing configuration provides robust, repeatable, gravity-enhanced alignment when the two components are mated.

Figure 12:
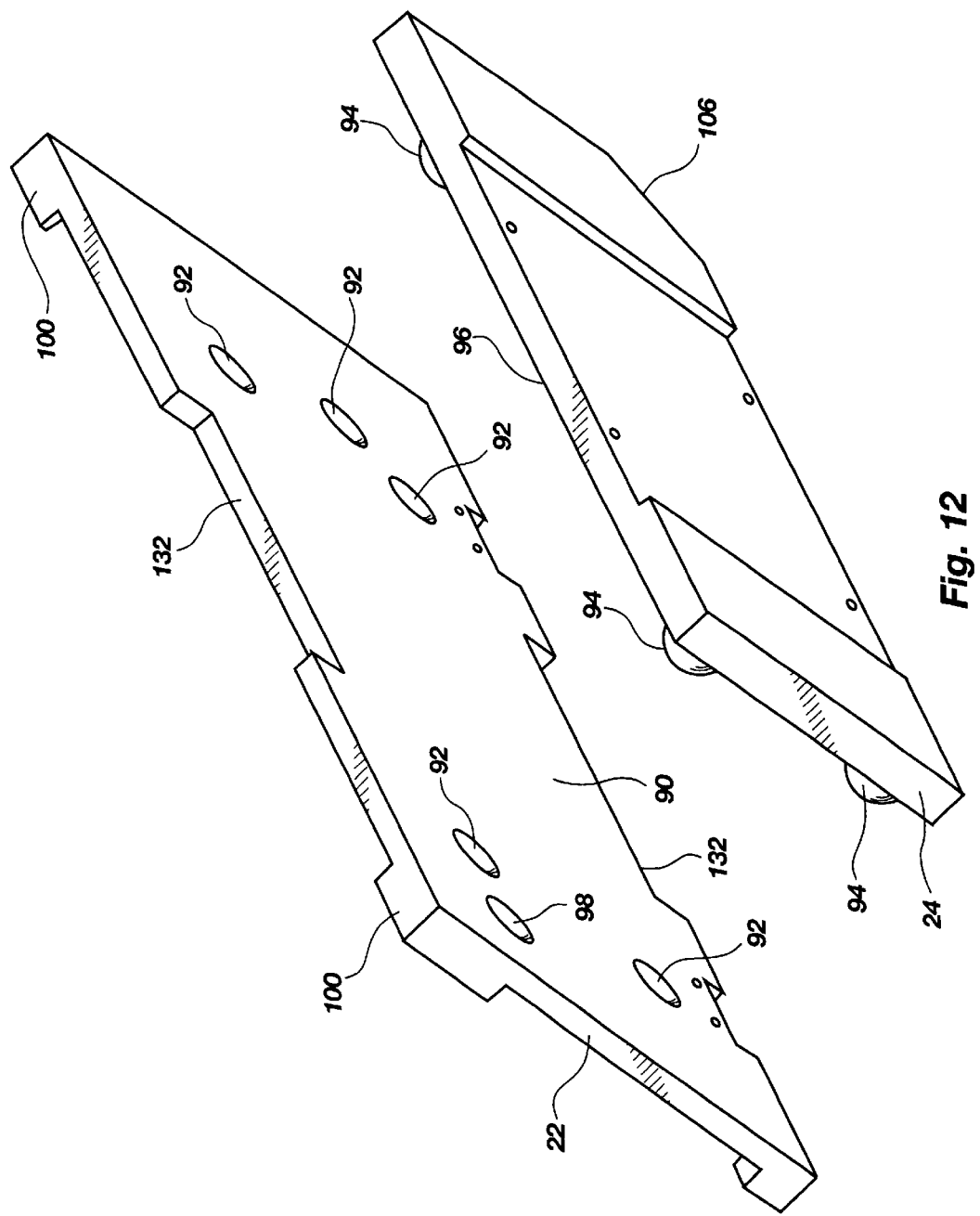
FIG. 12 is a bottom, exploded perspective view of the tray carrier and cooperating tray transport of FIG. 10.
Figure 13:
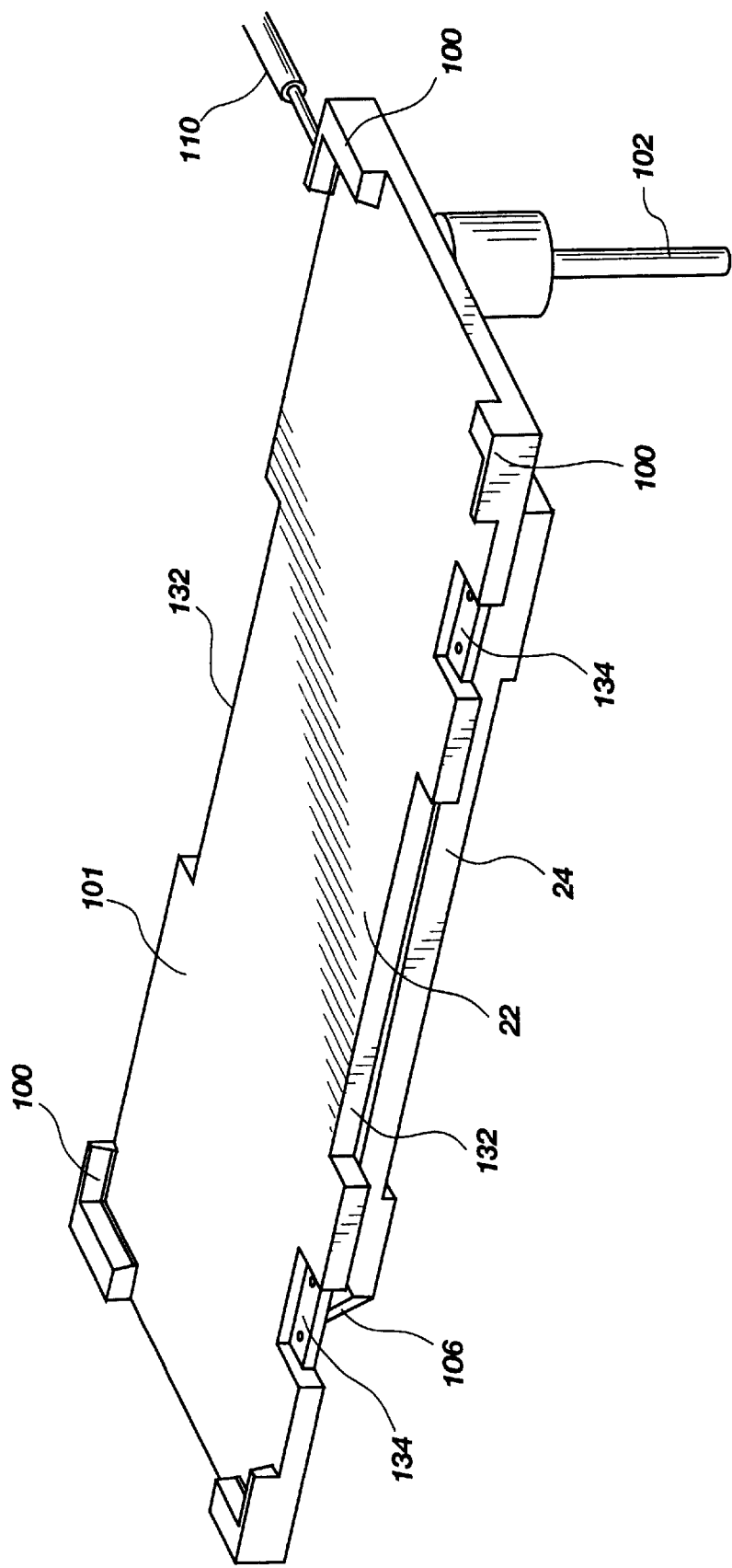
FIG. 13 is a perspective view of a tray carrier and cooperating tray transport of the present invention in a position for tilting of the tray carrier with respect to the tray transport.
Figure 14:
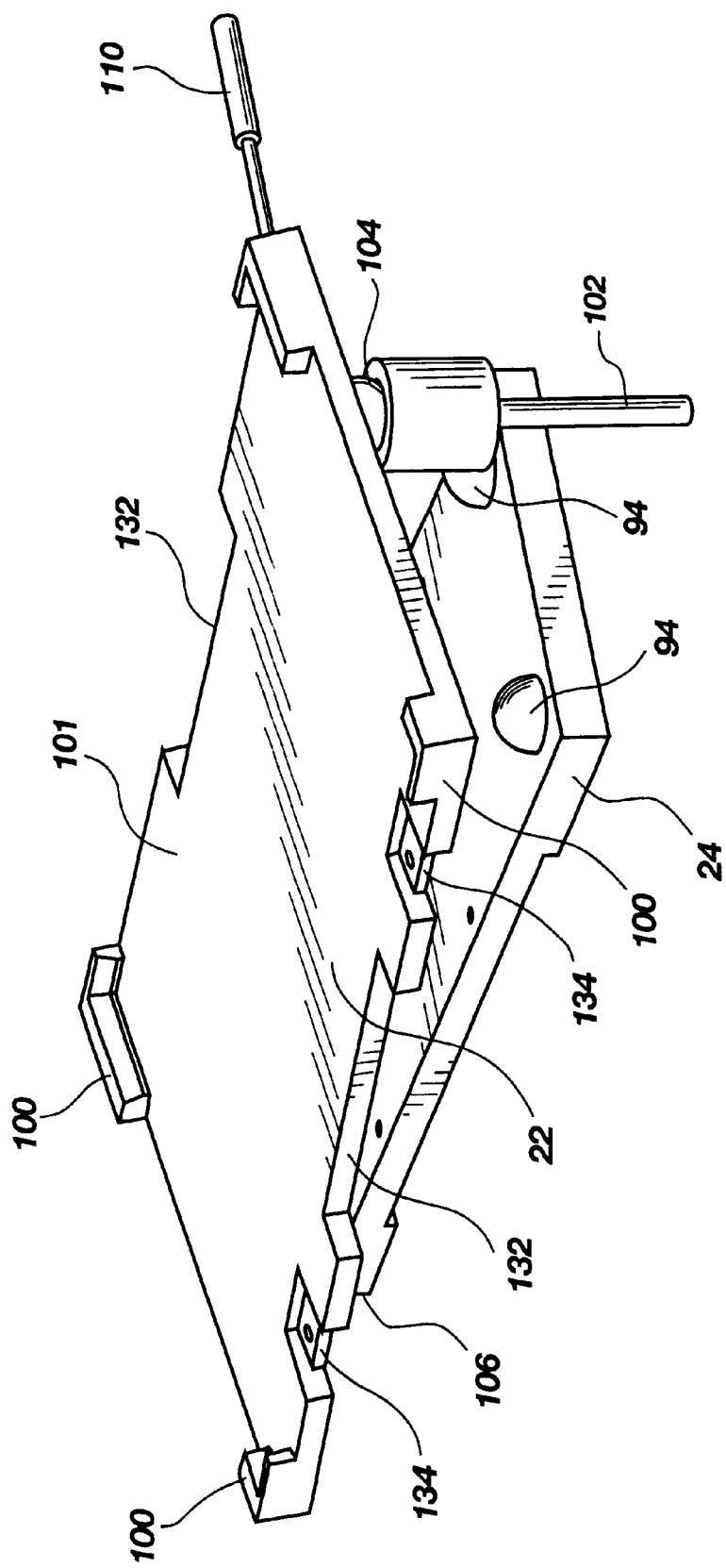
FIG. 14 is a perspective view of the tray carrier of FIG. 13, tilted with respect to the tray transport.

Referring to FIG. 12 of the drawings, the reader will note the presence of an additional hemispherical recess 98 on lower surface 90 of tray carrier 22 offset from the four hemispherical recesses 92. Additional recess 98, when used with a longitudinally foreshortened (in comparison to tray carrier 22) tray transport 24 as shown in FIGS. 11–14, permits the tilting of a tray 200 on tray carrier 22 (constrained against movement, of course, by corner stops 100 extending upwardly from substantially planar upper surface 101 of tray carrier 22) by vertical extension of a shaft 102 of an air cylinder (not shown), shaft 102 being surmounted by a bearing cylinder supporting a spherical bearing 104 of like radius to bearings 94 and aligned with additional recess 98 . The two recesses 92 most distant from, and diagonally located with respect to, additional recess 98, engaged by their cooperating bearings 94 of tray transport 24, provide a tilt pivot point or fulcrum for tilting of tray carrier 22 and the tray 200 residing therein at an angle to the longitudinal axis of the normally superimposed tray carrier 22 and tray transport 24, such tilting being further facilitated by diagonal truncation or cutout 106 of the nearby corner of tray transport 24. Tilting results in movement of each IC package 202 in a tray borne by the tray carrier 22 toward the same corner of the tray recess 204 (FIG. 2) in which that IC package 202 is located. Also noteworthy in FIGS. 13 and 14 is the presence of part movement facilitator 110, which may comprise a vibrator, or an air cylinder actuated to "tap" the tray carrier 22 repeatedly to overcome any sliding friction preventing the IC packages from moving to their desired positions. The tray tilting location (with optional part movement facilitator 110) may be at the position of tray transport 24 under the laser marking station 18 to effect precise alignment of IC packages 202 immediately before marking or may be located at the upstream side of laser marking station 18 where tray carrier 22 passes under inspection camera 30, so that the position of each IC package 202 may be checked.

Figure 15:
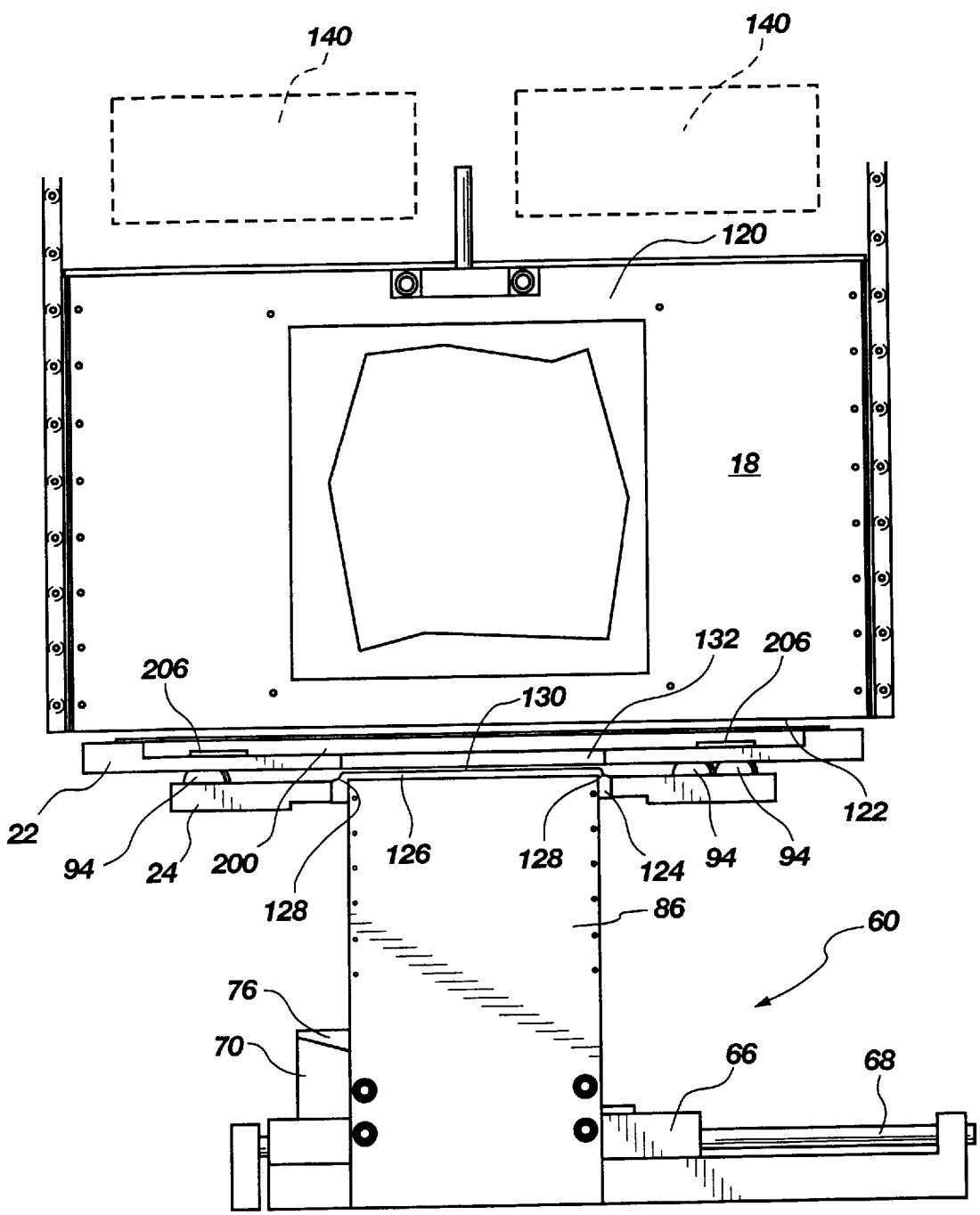
FIG. 15 is a side elevation of a laser marking station with a doorless enclosure according to one embodiment of the present invention and a lift mechanism according to the invention positioned to lift a tray carrier into the enclosure.
Figure 16:
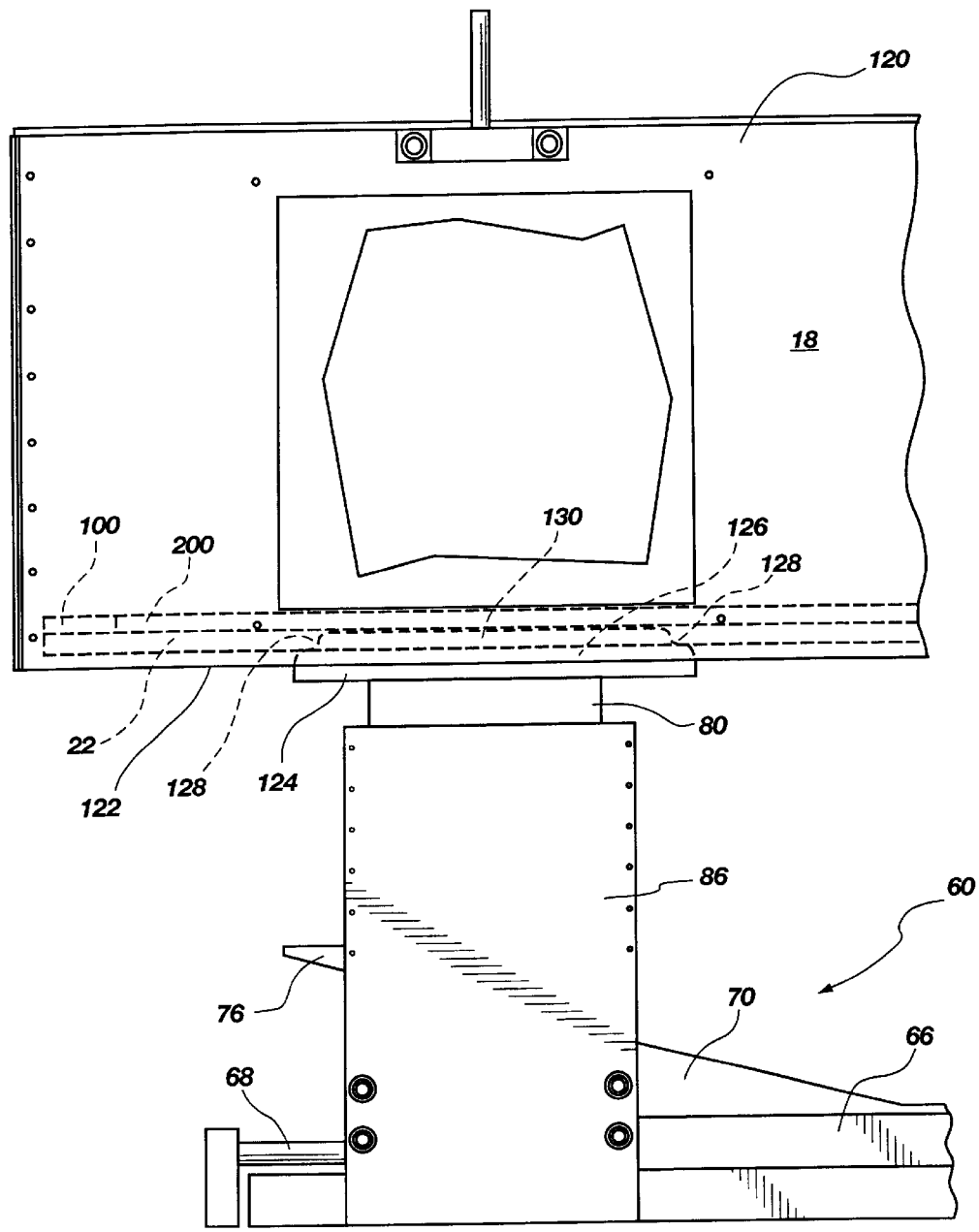
FIG. 16 is an enlarged side elevation of the apparatus depicted in FIG. 15 with the tray carrier lifted into the enclosure of the laser marking station to effect complete light containment in cooperation therewith.

Yet another significant feature of the laser marking system of the present invention is the configuration of laser marking station 18. Specifically, laser marking station 18 employs a substantially bottomless enclosure 120 having four sides and a roof (see FIGS. 1, 2, 15 and 16) which, unlike conventional marking stations previously referenced herein, does not require opening and closing of access shutters to admit a group of IC packages to be marked. Instead, a tray 200 of unmarked IC packages 202 positioned below enclosure 120 as shown in FIG. 15 and residing on carrier tray 22, which in turn rests on tray transport 24 of transport actuator 16 (not shown in FIGS. 15 and 16 for clarity), may be raised off of tray transport 24 into the opening 122 defined in the bottom of enclosure 120 when contacted by parallel extensions 124 at the tops of side plates 80 of lift structure 78, the upper ends 126 of extensions 124 including notched edges 128 bracketing a central protrusion 130 sized and located to closely fit within elongated side notches 132 of tray carrier 22. As shown in FIGS. 10–14, the lateral extent or width of tray transport 24 is less than that of tray carrier 22 so that side plates 80 pass outboard of tray transport 24 before extensions 124 engage elongated side notches 132 of tray carrier 22. As shown in FIG. 16, when lift structure 78 of lift mechanism 60 is fully vertically extended, tray carrier 22 is substantially contained within enclosure 120 and the tray 200 is located completely within enclosure 120 at the proper focal length for laser marking with the assurance that laser light emitted from the marking heads will be completely contained within enclosure 120. Further, tray carrier 22 is sized and shaped to act as a substantially light-tight closure to bottom opening 122 of enclosure 120. Completion of the closure is effected by the presence of extensions 124 in elongated side notches 132, extensions 124 being of adequate width to fill the width of notches 132. Assurance of a light-tight enclosure 120 may be further provided with magnetic sensors on the interior of enclosure 120 which will confirm the proper location of tray carrier 22 in position responsive to the presence in the proper location within enclosure 120 of two magnets 134 (FIGS. 10, 11, 13 and 14) secured in tray carrier 22.

It is preferred that two laser marking heads 140, under control of separate electronics and powered from a single laser output beam divided by a beam splitter, are focused on separate portions of a marking field within enclosure 120. Thus, a 6 inch by 12 inch marking field may be defined, affording the capability to mark IC packages 202 of an entire tray 200 without tray movement. A suitable laser marking device is the Model 1900, offered by General Scanning. To further ensure proper operation of the laser marking system 10 and provide additional assurance against premature actuation thereof, it may be appropriate to include sensors, such as optical or magnetic sensors, to sense the presence of a tray 200 in the laser marking field.

With respect to the tray handling aspects of the invention, it may also be desirable to provide sensors to sense when tray output shuttle assembly 14 is full of trays 200 and when a tray 200 has cleared the level of tray support elements 50. Similarly, tray input shuttle assembly 12 may employ a tray presence sensor to confirm that a tray 200 is, in fact, loaded onto tray carrier 22 and a stack presence sensor to detect when there are no more trays 200 present to be loaded onto tray carrier 22. Fiber-optic reflection-type sensors are one exemplary sensor technology which may be employed. In addition, such sensors may be employed to sense the position of the air cylinder shafts 64 and drive blocks 66 of lift mechanisms 60.

While the present invention has been described in the context of an illustrated embodiment, those of ordinary skill in the art will recognize and appreciate that it is not so limited. Specifically and without limitation, additions or modifications to, or deletions from, the apparatus of the invention and its operation as described may be made without departing from the scope of the invention as defined by the claims appended hereto. In addition, various elements and subassemblies of the overall system of the present invention as disclosed also individually and in various combinations are included within the ambit of the present invention.

What is claimed is:

1. A method of marking a plurality of IC packages carried in a tray, comprising:

providing at least one tray carrying a plurality of discrete IC packages;

lowering the at least one tray and the plurality of discrete IC packages carried thereby from a first position to a second position;

moving the at least one tray and the plurality of discrete IC packages carried thereby horizontally to a third position;

raising the at least one tray and the plurality of discrete IC packages carried thereby to a fourth position;

marking the plurality of discrete IC packages carried by the at least one tray at the fourth position;

lowering the at least one tray and the plurality of discrete IC packages carried thereby to the third position;

moving the at least one tray and the plurality of discrete IC packages carried thereby horizontally to a fifth position; and raising the at least one tray and the plurality of discrete IC packages carried thereby to a sixth position.

2. The method of claim 1, wherein the at least one tray comprises a plurality of vertically stacked trays at the first position and further comprising removing a lowermost tray from the plurality of stacked trays to lower the removed tray to the second position and proceed the removed tray therefrom through the third, fourth, fifth and sixth positions.

3. The method of claim 2, further comprising raising the removed tray to the bottom of a vertical stack comprising a plurality of trays at the sixth position.

4. The method of claim 1, further comprising raising the at least one tray and the plurality of discrete IC packages carried thereby into an enclosure at the fourth position and substantially concurrently sealing the enclosure against light leakage therefrom.

5. The method of claim 1, wherein the marking is effected by laser light.

6. The method of claim 5, wherein the marking is effected substantially simultaneously in two adjacent fields, each of the fields approximating one-half of an area of the at least one tray and containing approximately half of the plurality of discrete IC packages.

7. The method of claim 6, further comprising inspecting a last discrete IC package carried by the at least one tray and marked in each of the two fields between the third and fifth positions.

8. The method of claim 1, further comprising tilting the at least one tray and plurality of discrete IC packages carried thereby before the at least one tray reaches the fourth position.

9. The method of claim 8, further comprising imparting force to the at least one, tilted tray to cause the plurality of discrete IC packages carried in recesses in the at least one, tilted tray to reach a substantially common alignment for marking.

* * * * *